US010566979B2

(12) United States Patent
Isohata et al.

(10) Patent No.: US 10,566,979 B2
(45) Date of Patent: Feb. 18, 2020

(54) OSCILLATOR, ELECTRONIC APPARATUS, AND BASE STATION

(71) Applicant: SEIKO EPSON CORPORATION, Tokyo (JP)

(72) Inventors: Kensaku Isohata, Minowa-machi (JP); Takayuki Kikuchi, Chino (JP); Takemi Yonezawa, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 90 days.

(21) Appl. No.: 15/916,701

(22) Filed: Mar. 9, 2018

(65) Prior Publication Data

US 2018/0198452 A1    Jul. 12, 2018

Related U.S. Application Data

(63) Continuation of application No. 15/223,435, filed on Jul. 29, 2016, now Pat. No. 9,941,888.

(30) Foreign Application Priority Data

Aug. 6, 2015   (JP) ................. 2015-155768

(51) Int. Cl.
*H03L 1/04* (2006.01)
*H03L 1/02* (2006.01)
*H03B 5/36* (2006.01)

(52) U.S. Cl.
CPC .............. *H03L 1/04* (2013.01); *H03B 5/36* (2013.01); *H03L 1/02* (2013.01); *H03L 1/022* (2013.01); *H03L 1/026* (2013.01); *H03L 1/028* (2013.01)

(58) Field of Classification Search
CPC . H03L 1/022; H03L 1/026; H03L 1/04; H03L 1/028; H03L 1/02; H03B 5/36
USPC ................................... 331/158, 116 FE, 176
See application file for complete search history.

(56) References Cited

U.S. PATENT DOCUMENTS

| 8,729,978 | B2 | 5/2014 | Akaike et al. | |
| 9,941,888 | B2 * | 4/2018 | Isohata | ............... H03L 1/028 |
| 2006/0237426 | A1 | 10/2006 | Matsuoka | |
| 2014/0361845 | A1 | 12/2014 | Ito | |
| 2015/0054590 | A1 | 2/2015 | Urabe | |

FOREIGN PATENT DOCUMENTS

| JP | H07-115323 A | 5/1995 |
| JP | 2005-117189 A | 4/2005 |
| JP | 2006-295570 A | 10/2006 |
| JP | 2007-273420 A | 10/2007 |
| JP | 2010-062868 A | 3/2010 |

(Continued)

OTHER PUBLICATIONS

Jun. 19, 2017 Office Action Issued in U.S. Appl. No. 15/223,435.
U.S. Appl. No. 15/223,435 filed Jul. 29, 2016 in the name of Isohata et al.

*Primary Examiner* — Arnold M Kinkead
(74) *Attorney, Agent, or Firm* — Oliff PLC

(57) ABSTRACT

An oscillator includes an oscillation source, multiple temperature control elements, and a controller adapted to perform control to suppress an increase in current consumed in one or more of the temperature control elements during at least part of a period from when operation of the oscillation source initiates to when the oscillation source reaches a specified temperature.

7 Claims, 13 Drawing Sheets

(56) References Cited

FOREIGN PATENT DOCUMENTS

| JP | 2012-209621 A | 10/2012 |
| JP | 2014-241508 A | 12/2014 |
| JP | 2015-041940 A | 3/2015 |
| JP | 2015-080057 A | 4/2015 |

\* cited by examiner

OSCILLATOR, ELECTRONIC APPARATUS, AND BASE STATION

This application is a Continuation of U.S. application Ser. No. 15/223,435 filed Jul. 29, 2016, which claims the benefit of Japanese Application No. 2015-155768 filed Aug. 6, 2015. The disclosures of the prior applications are hereby incorporated by reference herein in their entireties.

BACKGROUND

1. Technical Field

The present invention relates to an oscillator, an electronic apparatus, and a base station.

2. Related Art

A crystal oscillator, which is used for a reference frequency signal source for communication equipment, a measurement instrument, or the like, is required to have the output frequency stable with high accuracy with respect to a change in temperature. In general, there is known an oven controlled crystal oscillator (OCXO) as a crystal oscillator capable of providing extremely high frequency stability among crystal oscillators.

In JP-A-2015-041940 (Document 1), there is described an oven controlled crystal oscillator having a first oven, a second oven disposed inside the first oven, a thermosensor for detecting the temperature inside the first oven, a first temperature control circuit for controlling a heater disposed inside the first oven based on the temperature detected by the thermosensor to control the temperature inside the first oven, a first resonator and a second resonator disposed inside the second oven, a frequency difference detection section for detecting a difference in oscillation frequency between the first resonator and the second resonator, and a second temperature control circuit for controlling a heater disposed inside the second oven based on the difference in frequency thus detected to control the temperature inside the second oven.

According to the oscillator described in Document 1, the first resonator and the second resonator are different in frequency characteristics to the temperature, and by arranging that the first temperature control circuit performs the temperature control in a temperature range in which the difference in oscillation frequency between the first resonator and the second resonator with respect to the resonator temperature corresponds one-to-one to each other, it is possible to use double-rotation cut such as SC/IT cut high in frequency stability with respect to the outside air temperature, and thus the temperature characteristics with respect to the frequency can be improved.

However, in the oven controlled oscillator with a plurality of heaters such as the oscillator described in Document 1, there is a possibility that the power consumption increases in particular at the time of startup to exceed the available power consumption.

SUMMARY

An advantage of some aspects of the invention is to provide an oscillator capable of reducing the possibility that the maximum value of the power consumption becomes excessively high. Another advantage of some aspects of the invention is to provide an electronic apparatus or a base station using the oscillator.

The invention can be implemented as the following aspects or application examples.

An oscillator according to this application example includes an oscillation source, a plurality of temperature control elements, and a controller adapted to perform control to suppress an increase in current consumed in at least one of the temperature control elements during at least part of a period from when operation of the oscillation source initiates to when the oscillation source reaches a specified temperature.

The oscillation source can be a variety of types of resonators such as a quartz crystal resonator, or can also be a gas cell in which atoms of cesium, rubidium, or the like are encapsulated.

The temperature control element can be a heat generation element or can also be a heat absorption element. The temperature control element can be, for example, a power transistor, a resistor, or a Peltier element.

The period during which current is suppressed (within the period from when operation of the oscillation source initiates to when the specified temperature is reached) can be a continuous period including a point immediately after the oscillation source starts the action.

According to the oscillator related to this application example, since high current can be prevented from flowing through all of the temperature control elements at the same time in at least part of the period from when operation of the oscillation source initiates to when the specified temperature is reached, it is possible to reduce the possibility that the maximum value of the power consumption becomes excessively high.

In the oscillator according to the application example described above, the controller may be adapted to perform the control so that the current consumed in at least one of the temperature control elements during at least part of the period is lower than a maximum value of current consumed in the at least one of the temperature control elements after the specified temperature has been reached.

According to the oscillator related to this application example, since high current can be prevented from flowing through at least one of the temperature control elements during the at least part of the period from when the operation of the oscillation source initiates to when the specified temperature is reached, it is possible to reduce the possibility that the maximum value of the power consumption becomes excessively high.

In the oscillator according to the application example described above, the controller may be adapted to perform the control so that no current, or very little current such as leakage current, flows through the at least one of the temperature control elements during the at least of the period.

According to the oscillator related to this application example, since no current flows through at least one of the temperature control elements during at least part of the period from when the operation of the oscillation source initiates to when the temperature is reached, it is possible to more surely reduce the possibility that the maximum value of the power consumption becomes excessively high. In the oscillator according to the application example described above, the oscillator may be adapted to perform the control based on at least one of temperature, oscillation frequency of the oscillation source, elapsed time from when the operation of the oscillation source initiates.

In the oscillator according to the application example described above, the oscillator may further include a first enclosure that houses a resonator as the oscillation source, and a second enclosure that houses the first enclosure.

In the oscillator according to the application example described above, the plurality of temperature control elements may include a first heat generation element adapted to control internal temperature of the first enclosure, and a second heat generation element adapted to control internal temperature of the second enclosure.

In the oscillator according to the application example described above, the controller may be adapted to perform the control so as to make current consumed in the second heat generation element during the at least part of the period lower than a maximum value of current consumed in the second heat generation element after the specified temperature has been reached.

According to the oscillator related to this application example, since the current flowing through the second heat generation element is relatively low even though relatively high current flows through the first heat generation element during at least part of the period from when the operation of the oscillation source initiates to when the specified temperature is reached, it is possible to reduce the possibility that the maximum value of the power consumption becomes excessively high.

In the oscillator according to the application example described above, the oscillator may further include a first temperature sensor adapted to measure the internal temperature of the first enclosure.

Application Example 9

In the oscillator according to the application example described above, the controller may be adapted to perform the control based on a temperature measured by the first temperature sensor.

According to the oscillator related to this application example, since the at least part of the period during which the current consumed in the second heat generation element should be limited is variably controlled in accordance with the internal temperature of the first enclosure, the possibility that the maximum value of the power consumption becomes excessively high can more surely be reduced.

In the oscillator according to the application example described above, the oscillator may further include a determination circuit adapted to output a determination signal representing whether or not a difference between the temperature measured by the first temperature sensor and the specified temperature is included in a set range, and the controller may be adapted to perform the control based on the determination signal.

According to the oscillator related to this application example, since the at least part of the period during which the current consumed in the second heat generation element should be limited is variably controlled in accordance with the difference between the internal temperature of the first enclosure and the specified temperature, the possibility that the maximum value of the power consumption becomes excessively high can more surely be reduced.

In the oscillator according to the application example described above, the controller may be adapted to perform the control so as to make current consumed in the first heat generation element during the at least part of the period lower than a maximum value of current consumed in the first heat generation element after the specified temperature has been reached.

According to the oscillator related to this application example, since the current flowing through the first heat generation element is relatively low even though relatively high current flows through the second heat generation element during the at least part of the period from when the operation of oscillation source initiates to when the specified temperature is reached, it is possible to reduce the possibility that the maximum value of the power consumption becomes excessively high.

In the oscillator according to the application example described above, the oscillator may further include a second temperature sensor adapted to detect the internal temperature of the second enclosure.

In the oscillator according to the application example described above, the controller may be adapted to perform the control based on a temperature measured by the second temperature sensor.

According to the oscillator related to this application example, since the at least part of the period during which the current consumed in the first heat generation element should be limited is variably controlled in accordance with the internal temperature of the second enclosure, the possibility that the maximum value of the power consumption becomes excessively high can more surely be reduced.

In the oscillator according to the application example described above, the controller may be adapted to perform the control based on the oscillation frequency of the oscillation source.

According to the oscillator related to this application example, focusing attention on the fact that the oscillation frequency of the oscillation source and the internal temperature of the first enclosure are generally correlated with each other, the at least part of the period during which the current consumed in the second heat generation element should be limited is variably controlled in accordance with the oscillation frequency of the oscillation source, and therefore, the possibility that the maximum value of the power consumption becomes excessively high can more surely be reduced.

In the oscillator according to the application example described above, the controller may be adapted to perform the control based on the elapsed time from when the operation of the oscillation source initiates.

According to the oscillator related to this application example, focusing attention on the fact that, in general, the longer the elapsed time from when the operation of the oscillation source initiates is, the larger the rise in the internal temperature of the first enclosure due to the heat generation of the first heat generation element is, or the larger the rise in the internal temperature of the second enclosure due to the heat generation of the second heat generation element is, the at least part of the period during which the current consumed in the first heat generation element or the second heat generation element should be limited is fixed based on the elapsed time, and thus, the possibility that the maximum value of the power consumption becomes excessively high can more surely be reduced.

An electronic apparatus according to this application example includes any one of the oscillators described above.

A base station according to this application example includes any one of the oscillators described above.

According to these application examples, since there is used the oscillator capable of reducing the possibility that the maximum value of the power consumption becomes excessively high, it is possible to realize, for example, the electronic apparatus and the base station hard to cause a malfunction and high in reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, some preferred embodiments of the invention will be described in detail using the accompanying drawings. It should be noted that the embodiments described below do not unreasonably limit the content of the invention as set forth in the appended claims. Further, all of the constituents described below are not necessarily essential elements of the invention.

1. Oscillator 1-1. First Embodiment

Figure 1:
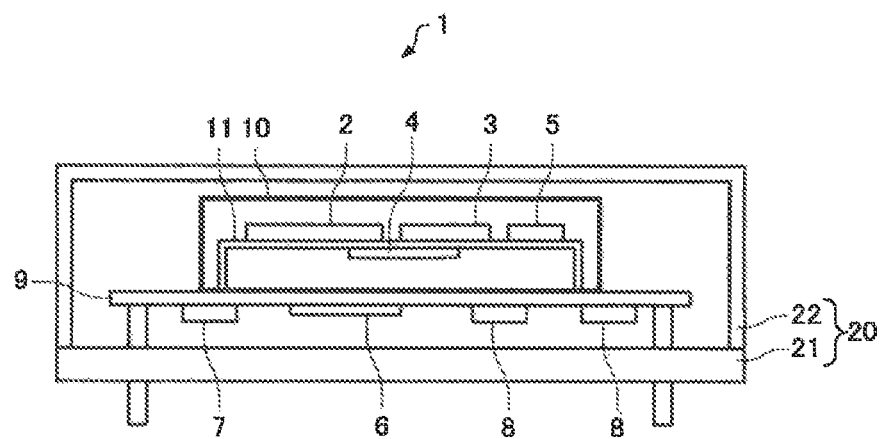
FIG. 1 is an example of a cross-sectional view of an oscillator according to an embodiment of the invention.
Figure 2:
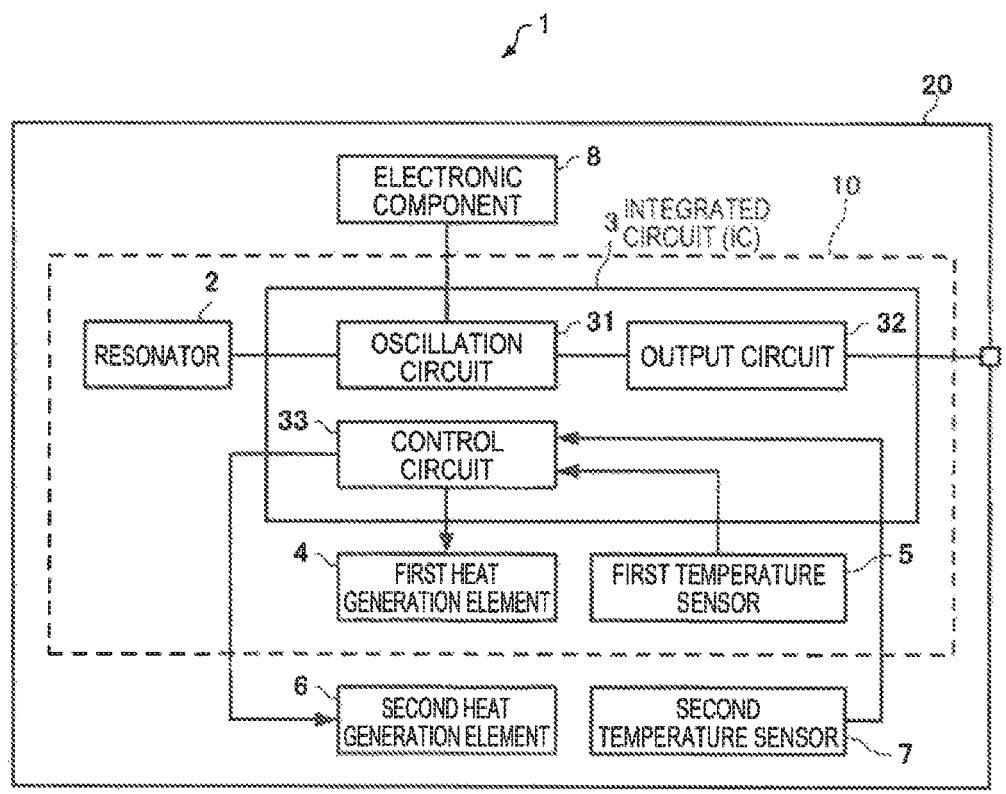
FIG. 2 is a functional block diagram of the oscillator according to a first embodiment of the invention.

FIG. 1 is an example of a cross-sectional view of an oscillator according to the present embodiment. Further, FIG. 2 is a functional block diagram of the oscillator 1 according to the first embodiment. The oscillator 1 according to the present embodiment is an oven controlled oscillator, and can also be an oven controlled crystal oscillator (OCXO).

As shown in FIG. 1, the oscillator 1 is configured including a resonator 2 (an example of an oscillation source), an integrated circuit (IC) 3, a first heat generation element 4 (an example of a temperature control element), a first temperature sensor 5, a second heat generation element 6 (an example of a temperature control element), a second temperature sensor 7, a first enclosure 10, and a second enclosure 20. Further, it is also possible for the oscillator 1 according to the present embodiment to include electronic components 8 (e.g., a resistor, a capacitor, and a coil).

The second enclosure 20 is constituted by a substrate 21 and a casing 22 bonded to each other. In the internal space of the second enclosure 20, there is disposed a component mounting board 9 so as to be opposed to the substrate 21, and the second heat generation element 6, the second temperature sensor 7, and the electronic components 8 are mounted on a lower surface of the component mounting board 9 opposed to the substrate 21 to thereby be housed in the internal space of the second enclosure 20.

Further, on the upper surface of the component mounting board 9, there is mounted the first enclosure 10. Further, the resonator 2, the integrated circuit (IC) 3, and the first temperature sensor 5 are mounted on an upper surface of a component mounting board 11, and the first heat generation element 4 is mounted on a lower surface of the component mounting board 11 to thereby be housed in the internal space of the first enclosure 10.

Terminals of the resonator 2, the first heat generation element 4, the first temperature sensor 5, the second heat generation element 6, the second temperature sensor 7, and the electronic components 8 are electrically connected respectively to desired terminals of the integrated circuit (IC) 3 with wiring patterns not shown. Further, some of the terminals of the integrated circuit (IC) 3 are electrically connected to external terminals disposed on a surface of the second enclosure 20 with wiring patterns not shown.

As the resonator 2, it is possible to use, for example, an SC-cut or AT-cut quartz crystal resonator or a surface acoustic wave (SAW) resonator. Further, a piezoelectric resonator other than crystal resonators or an MEMS (micro electro mechanical systems) resonator, for example, can also be used as the resonator 2. As a substrate material of the resonator 2, there can be used, for example, a piezoelectric single crystal such as a quartz crystal, lithium tantalate, or lithium niobate, a piezoelectric material such as piezoelectric ceramics including, for example, lead zirconate titanate, or a silicon semiconductor material. Further, as an excitation device of the resonator 2, there can be used a device using a piezoelectric effect, or electrostatic drive using a Coulomb force.

It is sufficient for the first heat generation element 4 and the second heat generation element 6 (an example of a plurality of temperature control elements) to be elements capable of generating heat, and an element generating heat due to current flowing through the element such as a resistor, a power transistor, or a Peltier element can also be adopted.

The first temperature sensor 5 and the second temperature sensor 7 can also be, for example, a thermistor (e.g., a negative temperature coefficient (NTC) thermistor, or a positive temperature coefficient (PTC) thermistor), a platinum resistor, or a temperature detection circuit using a bandgap of a semiconductor.

The integrated circuit (IC) 3 oscillates the resonator 2 to generate an oscillation signal, and then outputs the oscillation signal to the external terminals not shown disposed on the surface of the second enclosure 20. Further, the integrated circuit (IC) 3 controls the heat generation of the first heat generation element 4, and at the same time controls the heat generation of the second heat generation element 6.

As shown in FIG. 2, the integrated circuit (IC) 3 is configured including an oscillation circuit 31, an output circuit 32, and a control circuit 33 (an example of a controller). It should be noted that it is also possible for the integrated circuit (IC) 3 to have a configuration obtained by eliminating or modifying some of these constituents, or adding other constituents.

The oscillation circuit 31 is connected to the resonator 2 and the electronic components 8 (e.g., a capacitor for oscillation), and oscillates the resonator 2 to generate the oscillation signal. The circuit constituted by the resonator 2, the oscillation circuit 31, and the electronic components 8 can also be a variety of types of oscillation circuit such as a pierce oscillator circuit, an inverter type oscillation circuit, a Colpitts oscillator circuit, or a Hartley oscillator circuit.

The output circuit 32 outputs the oscillation signal having been generated by the oscillation circuit 31 to the external terminals disposed on the surface of the second enclosure 20. The output circuit 32 can also be a differential output circuit such as a low voltage differential signaling (LVDS) circuit, a positive emitter coupled logic (PECL) circuit, or a low voltage PECL (LVPECL) circuit, or can also be a single-ended output circuit. Further, it is also possible for the output circuit 32 to divide the oscillation signal generated by the oscillation circuit 31, and then output the oscillation signal thus divided.

An output signal of the first temperature sensor 5 and an output signal of the second temperature sensor 7 are input to the control circuit 33, and then the control circuit 33 outputs a first control signal for controlling the heat generation of the first heat generation element 4 and a second control signal for controlling the heat generation of the second heat generation element 6.

Specifically, the control circuit 33 suppresses an increase in current consumed in at least one of the first heat generation element 4 and the second heat generation element 6 in at least part of a period (hereinafter referred to as a "start-up period") from when the resonator 2 starts to when a specified temperature (a first specified temperature Tset1) is reached. For example, it is possible for the control circuit 33 to perform the control so that no current flows through at least one of the first heat generation element 4 and the second heat generation element 6. It should be noted that it is also possible to allow an unwanted small current such as a leakage current to flow through the first heat generation element 4 or the second heat generation element 6 which is controlled by the control circuit 33 so that no current flows.

It is also possible for the control circuit 33 to set the start-up period based on the temperature detected by the first temperature sensor 5, and then suppress an increase in the current consumed in the second heat generation element 6 during the start-up period (perform the control so that, for example, no current flows). Alternatively, it is also possible for the control circuit 33 to set the start-up period based on the temperature detected by the second temperature sensor 7, and then suppress an increase in the current consumed in the first heat generation element 4 during the start-up period (perform the control so that, for example, no current flows).

Further, after the start-up period is terminated, the control circuit 33 controls the heat generation of the first heat generation element 4 so that the internal space of the first enclosure 10 is kept at the vicinity of the first specified temperature Tset1 based on the output signal of the first temperature sensor 5. Similarly, after the start-up period is terminated, the control circuit 33 controls the heat generation of the second heat generation element 6 so that the internal space of the second enclosure 20 is kept at the vicinity of a second specified temperature Tset2 based on the output signal of the second temperature sensor 7. The second specified temperature Tset2 can be the same temperature as the first specified temperature Tset1, or can also be a different temperature from the first specified temperature Tset1.

The first enclosure 10 functions as a first oven to keep the internal temperature of the first enclosure 10 at the first specified temperature Tset1 as described above, and therefore, the fluctuation of the oscillation frequency of the resonator 2 caused by a change in temperature can be reduced. Further, the second enclosure 20 functions as a second oven to keep the internal temperature of the second enclosure 20 at the second specified temperature Tset2, and therefore, the fluctuation of the oscillation frequency of the resonator 2 caused by a change in temperature can be reduced.

The first specified temperature Tset1 can be the temperature at which the oscillation frequency of the resonator 2 has a peak. For example, if the resonator 2 is an SC-cut quartz crystal resonator, since the frequency-temperature characteristic of the resonator 2 draws a quadratic curve with the temperature as a variable in an ambient temperature range (for example, the range between −40° C. and +85° C.) in which the operation of the oscillator 1 is guaranteed, the first specified temperature Tset1 can be the temperature corresponding to the peak of the quadratic curve. Further, if the resonator 2 is an AT-cut quartz crystal resonator, since the frequency-temperature characteristic of the resonator 2 draws a cubic curve with the temperature as a variable, the first specified temperature Tset1 can also be the temperature corresponding to either of the peaks of the cubic curve. By setting the first specified temperature Tset1 to the temperature at which the oscillation frequency of the resonator 2 has the peak as described above, the oscillation frequency of the resonator 2 hardly varies even if the temperature of the resonator 2 varies in some degree in the vicinity of the first specified temperature Tset1, and therefore, the heat generation control of the first heat generation element 4 by the control circuit 33 becomes easy.

Figure 3:
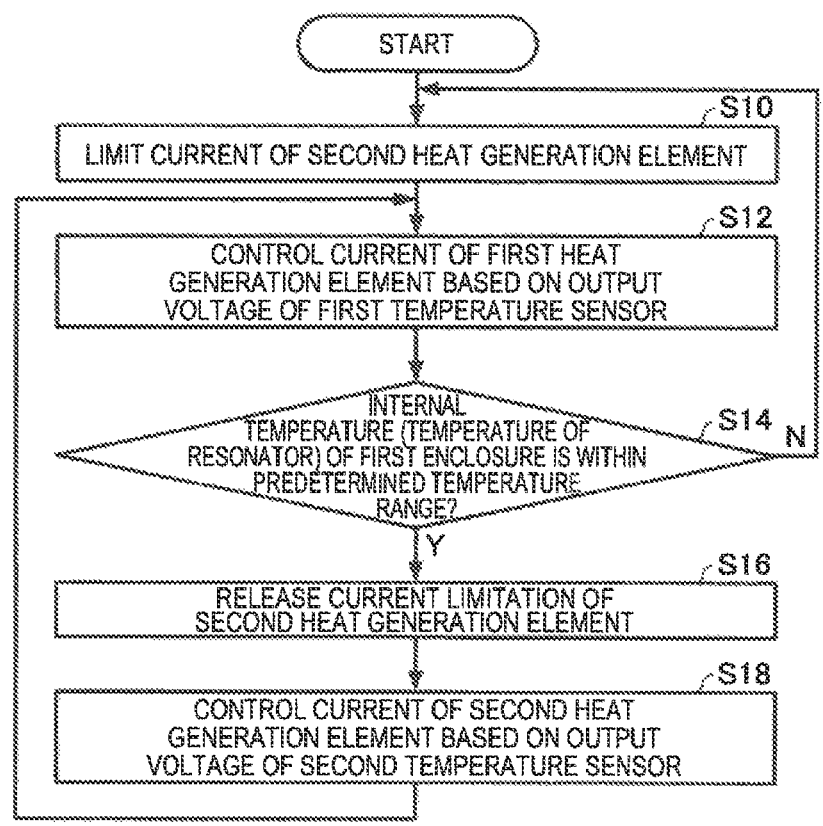
FIG. 3 is a flowchart showing an example of a procedure of heat generation control by the oscillator according to the first embodiment.

FIG. 3 is a flowchart showing an example of a procedure of the heat generation control of the first heat generation element 4 and the second heat generation element 6 by the control circuit 33 in the oscillator 1 according to the first embodiment.

In the example shown in FIG. 3, when a desired power supply voltage is supplied to the oscillator 1 (the control circuit 33), the control circuit 33 limits (S10) the current of the second heat generation element 6. For example, the control circuit 33 performs the control so that no current flows through the second heat generation element 6.

Further, the control circuit 33 controls (S12) the current of the first heat generation element 4 based on the output voltage of the first temperature sensor 5. For example, in the case in which the control circuit 33 has determined that the internal temperature (the temperature of the resonator 2) of the first enclosure 10 is lower than the first specified temperature Tset1 based on the output voltage of the first temperature sensor 5, the control circuit 33 performs the control so that the current corresponding to the difference between the first specified temperature Tset1 and the internal temperature (the temperature of the resonator 2) of the first enclosure 10 flows through the first heat generation element 4 to thereby make the first heat generation element 4 generate heat. Further, in the case in which the control circuit 33 has determined that the internal temperature (the temperature of the resonator 2) of the first enclosure 10 is higher than the first specified temperature Tset1 based on the output voltage of the first temperature sensor 5, the control circuit 33 performs the control so that no current flows through the first heat generation element 4 to thereby stop the heat generation by the first heat generation element 4.

Then, the control circuit 33 determines (S14) whether or not the internal temperature (the temperature of the resonator 2) of the first enclosure 10 is in a predetermined temperature range based on the output voltage of the first temperature sensor 5. Here, the predetermined temperature range is determined in advance taking the first specified temperature Tset1, the maximum current consumption of the oscillator 1, and so on into consideration. For example, the predetermined temperature range can be a range (e.g., a temperature range in which the oscillation frequency of the resonator 2 becomes in a range of plus/minus several ppm with respect to a target frequency Ftarget) of plus/minus several degrees Celsius with respect to the first specified temperature Tset1, or can also be in a range equal to or higher than the temperature several degrees Celsius lower than the first specified temperature Tset1 if the ambient temperature at the time of startup of the oscillator 1 (when the oscillator 1 is powered on) is necessarily lower than the first specified temperature Tset1.

If the internal temperature (the temperature of the resonator 2) of the first enclosure 10 is out of the predetermined temperature range (N in S14), the control circuit 33 continues the control in the step S10 and the step S12, and performs the determination in the step S14 again.

Further, if the internal temperature (the temperature of the resonator 2) of the first enclosure 10 is within the predetermined temperature range (Y in S14), the control circuit 33 releases (S16) the current limitation of the second heat generation element 6, and controls (S18) the current of the second heat generation element 6 based on the output voltage of the second temperature sensor 7. For example, in the case in which the control circuit 33 has determined that the internal temperature of the second enclosure 20 is lower than the second specified temperature Tset2 based on the output voltage of the second temperature sensor 7, the control circuit 33 performs the control so that the current corresponding to the difference between the second specified temperature Tset2 and the internal temperature of the second enclosure 20 flows through the second heat generation element 6 to thereby make the second heat generation element 6 generate heat. Further, in the case in which the control circuit 33 has determined that the internal temperature of the second enclosure 20 is higher than the second specified temperature Tset2 based on the output voltage of the second temperature sensor 7, the control circuit 33 performs the control so that no current flows through the second heat generation element 6 to thereby stop the heat generation by the second heat generation element 6.

Then, the control circuit 33 repeats the process in the step S12 and the subsequent steps.

In the flowchart shown in FIG. 3, the period during which the steps S10 through S14 are repeated corresponds to the start-up period, and the control circuit 33 sets the start-up period based on the temperature (the internal temperature of the first enclosure 10) detected by the first temperature sensor 5.

Figure 4:
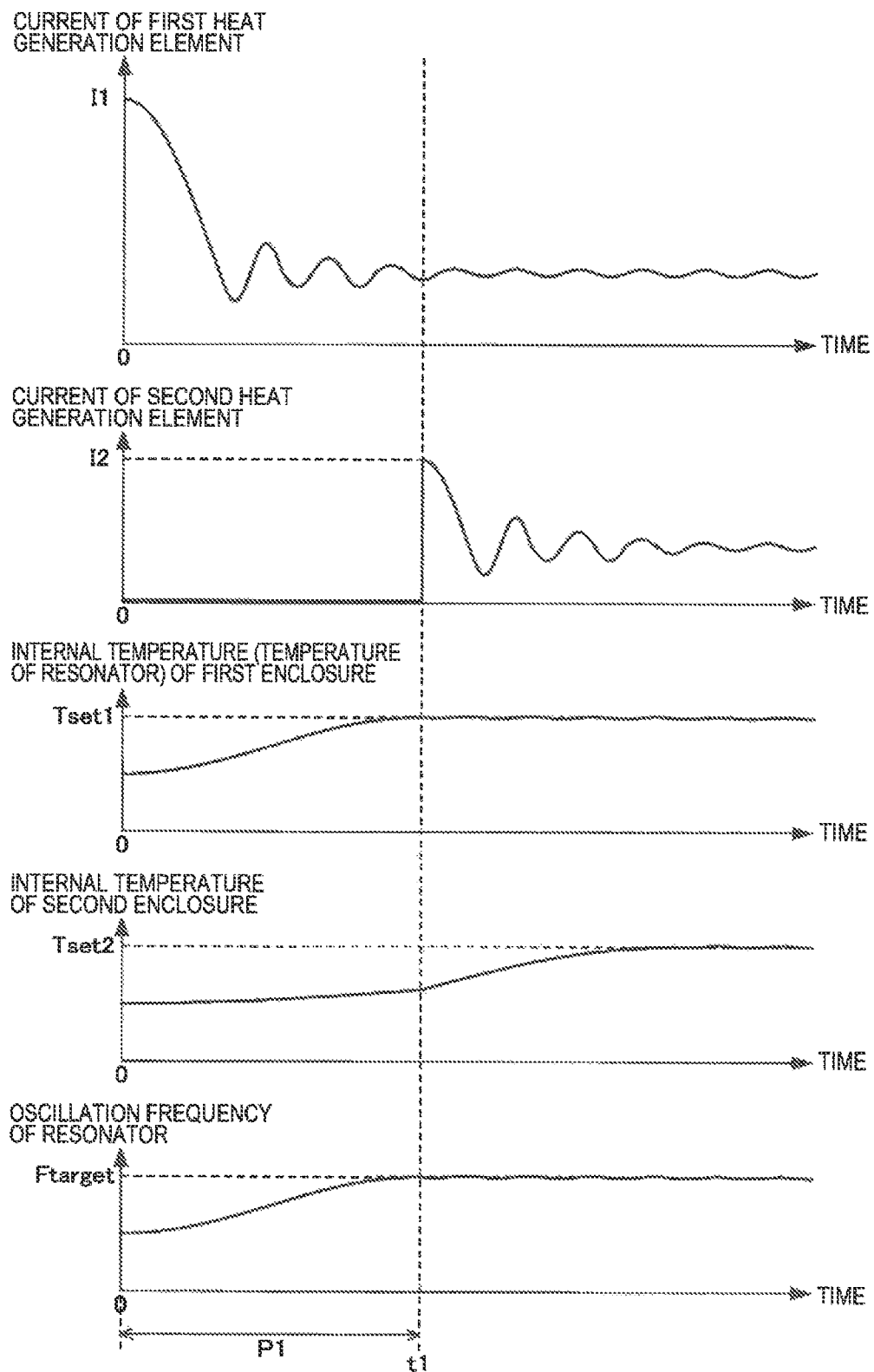
FIG. 4 is a diagram showing the condition of the temporal changes in the current of a first heat generation element, the current of a second heat generation element, the internal temperature of a first enclosure, the internal temperature of a second enclosure, and the oscillation frequency of a resonator in the case of performing the heat generation control with the procedure shown in FIG. 3.

FIG. 4 is a diagram showing the condition of the temporal changes in the current of the first heat generation element 4, the current of the second heat generation element 6, the internal temperature of the first enclosure 10, the internal temperature of the second enclosure 20, and the oscillation frequency of the resonator 2 in the case in which the control circuit 33 performs the heat generation control with the procedure shown in FIG. 3. In the example shown in FIG. 4, the time of startup of the oscillator 1 (when the oscillator 1 is powered on) is defined as time 0. Further, in the example shown in FIG. 4, the resonator 2 is an SC-cut quartz crystal resonator having the quadratic frequency-temperature characteristic, and has a peak of the oscillation frequency in, for example, the vicinity of 80° C. Further, the ambient temperature at the time of startup of the oscillator 1 (when the oscillator 1 is powered on) is in the vicinity of, for example, 25° C., and the first specified temperature Tset1 and the second specified temperature Tset2 are both in the vicinity of, for example, 80° C. (in the vicinity of the temperature at which the oscillation frequency of the resonator 2 has a peak).

In the example shown in FIG. 4, the control circuit 33 controls (the step S12 shown in FIG. 3) the current of the first heat generation element 4 from the time 0 based on the output voltage of the first temperature sensor 5. The internal temperature of the first enclosure 10 and the internal temperature of the second enclosure 20 at the time of startup of the oscillator 1 (when the oscillator 1 is powered on) are both close to the ambient temperature (e.g., the vicinity of 25° C.) of the oscillator 1. Therefore, since the internal temperature of the first enclosure 10 is lower than the first specified temperature Tset1, and further the difference between the first specified temperature Tset1 and the internal temperature of the first enclosure 10 is large, a high current I1 is flowing through the first heat generation element 4 at the time 0. Further, the oscillation frequency of the resonator 2 is lower than the target frequency Ftarget.

Subsequently, as the internal temperature of the first enclosure 10 rises due to the heat generation by the first heat generation element 4, the difference between the first specified temperature Tset1 and the internal temperature of the first enclosure 10 decreases. Therefore, the current flowing through the first heat generation element 4 gradually decreases, and the internal temperature of the first enclosure 10 becomes stable at the first specified temperature Tset1. Further, as the internal temperature of the first enclosure 10 rises, the temperature of the resonator 2 also rises. Therefore, the oscillation frequency of the resonator 2 rises, and is then stabilized at the target frequency Ftarget.

Further, the control circuit 33 performs the control so that no current flows through the second heat generation element 6 (step S10 shown in FIG. 3) and the current of the second heat generation element 6 is nearly 0 (a small amount of current due to the leakage current and so on) in the start-up period P1 from the time 0 to the time t1 when the internal temperature (the temperature of the resonator 2) of the first enclosure 10 reaches the temperature (the predetermined temperature range) in the vicinity of the first specified temperature Tset1. It should be noted that in the start-up period P1, as the internal temperature of the first enclosure 10 rises due to the heat generation of the first heat generation element 4, the internal temperature of the second enclosure 20 housing the first enclosure 10 also rises slightly.

Then, at and after the time t1, the control circuit 33 controls (step S12 shown in FIG. 3) the current of the first heat generation element 4 based on the output voltage of the first temperature sensor 5, and at the same time, controls (step S18 shown in FIG. 3) the current of the second heat generation element 6 based on the output voltage of the second temperature sensor 7. At the time t1, since the internal temperature of the second enclosure 20 is lower than the second specified temperature Tset2, and further the difference between the second specified temperature Tset2 and the internal temperature of the second enclosure 20 is large, a high current I2 is flowing through the second heat generation element 6.

Subsequently, as the internal temperature of the second enclosure 20 rises due to the heat generation by the second heat generation element 6, the difference between the second specified temperature Tset2 and the internal temperature of the second enclosure 20 decreases. Therefore, the current flowing through the second heat generation element 6 decreases. Then, the internal temperature of the second enclosure 20 approaches the second specified temperature Tset2, and is then stabilized at the second specified temperature Tset2.

As described above, according to the procedure shown in FIG. 3, the internal temperature (the temperature of the resonator 2) of the first enclosure 10 is stabilized at the first specified temperature Tset1. Further, since the internal temperature of the second enclosure 20 is stabilized at the second specified temperature Tset2, even if the ambient temperature of the oscillator 1 dramatically varies, only a little influence is exerted on the internal temperature (the temperature of the resonator 2) of the first enclosure 10, and the internal temperature (the temperature of the resonator 2) of the first enclosure 10 hardly varies. Therefore, since the temperature of the resonator 2 is kept at the first specified temperature Tset1, the oscillator 1 extremely high in frequency stability can be realized.

Further, as shown in FIG. 4, the control circuit 33 performs the control so as to make the current (nearly 0) consumed in the second heat generation element 6 in the start-up period P1 lower than the maximum value (I2) of the current consumed in the second heat generation element 6 after the resonator 2 reaches the first specified temperature Tset1. Therefore, in the start-up period P1, since the current consumption of the second heat generation element 6 is low even though the current consumption of the first heat generation element 4 is high, there is a little possibility that the sum of the current consumption of the first heat generation element 4 and the current consumption of the second heat generation element 6 becomes excessively high. Further, also at the point immediately after the start-up period P1 elapses at which the current consumption of the second heat generation element 6 becomes the highest, since the current consumption of the first heat generation element 4 is relatively low, there is a little possibility that the sum of the current consumption of the first heat generation element 4 and the current consumption of the second heat generation element 6 becomes excessively high. Therefore, it is possible to reduce the possibility that the maximum value of the power consumption of the oscillator 1 becomes excessively high.

In particular, according to the procedure shown in FIG. 3, since the control circuit 33 makes the first heat generation element 4 start generating heat immediately after the startup of the oscillator 1, it is possible to shorten the time until the internal temperature (the temperature of the resonator 2) of the first enclosure 10 reaches the first specified temperature Tset1. Therefore, it is possible to shorten the time until the oscillator 1 stably oscillates at the target frequency Ftarget compared to a procedure shown in FIG. 5 described later.

Figure 5:
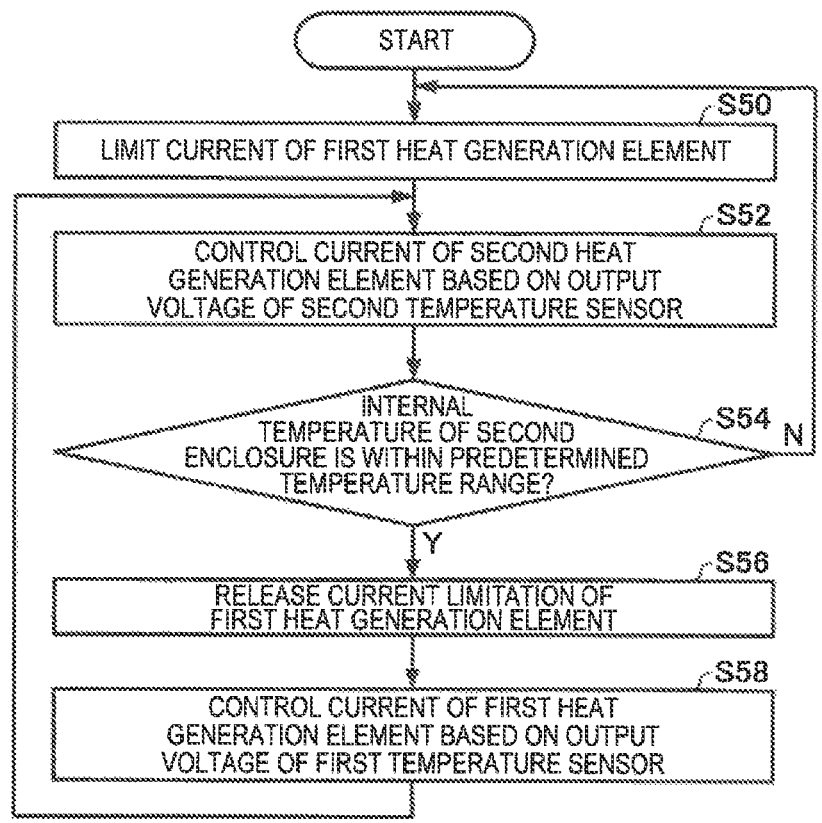
FIG. 5 is a flowchart showing another example of the procedure of the heat generation control by the oscillator according to the first embodiment.

FIG. 5 is a flowchart showing another example of the procedure of the heat generation control of the first heat generation element 4 and the second heat generation element 6 by the control circuit 33 in the oscillator 1 according to the first embodiment.

In the example shown in FIG. 5, when a desired power supply voltage is supplied to the oscillator 1 (the control circuit 33), the control circuit 33 limits (S50) the current of the first heat generation element 4. For example, the control circuit 33 performs the control so that no current flows through the first heat generation element 4.

Further, the control circuit 33 controls (S52) the current of the second heat generation element 6 based on the output voltage of the second temperature sensor 7. For example, in the case in which the control circuit 33 has determined that the internal temperature of the second enclosure 20 is lower than the second specified temperature Tset2 based on the output voltage of the second temperature sensor 7, the control circuit 33 performs the control so that the current corresponding to the difference between the second specified temperature Tset2 and the internal temperature of the second enclosure 20 flows through the second heat generation element 6 to thereby make the second heat generation element 6 generate heat. Further, in the case in which the control circuit 33 has determined that the internal temperature of the second enclosure 20 is higher than the second specified temperature Tset2 based on the output voltage of the second temperature sensor 7, the control circuit 33 performs the control so that no current flows through the second heat generation element 6 to thereby stop the heat generation by the second heat generation element 6.

Then, the control circuit 33 determines (S54) whether or not the internal temperature of the second enclosure 20 is in a predetermined temperature range based on the output voltage of the second temperature sensor 7. Here, the predetermined temperature range is determined in advance taking the second specified temperature Tset2, the maximum current consumption of the oscillator 1, and so on into consideration. For example, the predetermined temperature range can be a range of plus/minus several degrees Celsius with respect to the second specified temperature Tset2, or can also be in a range equal to or higher than the temperature several degrees Celsius lower than the second specified temperature Tset2 if the ambient temperature at the time of startup of the oscillator 1 (when the oscillator 1 is powered on) is necessarily lower than the second specified temperature Tset2.

If the internal temperature of the second enclosure 20 is out of the predetermined temperature range (N in S54), the control circuit 33 continues the control in the step S50 and the step S52, and performs the determination in the step S54 again.

Further, if the internal temperature of the second enclosure 20 is within the predetermined temperature range (Y in S54), the control circuit 33 releases (S56) the current limitation of the first heat generation element 4, and controls (S58) the current of the first heat generation element 4 based on the output voltage of the first temperature sensor 5. For example, in the case in which the control circuit 33 has determined that the internal temperature (the temperature of the resonator 2) of the first enclosure 10 is lower than the first specified temperature Tset1 based on the output voltage of the first temperature sensor 5, the control circuit 33 performs the control so that the current corresponding to the difference between the first specified temperature Tset1 and the internal temperature (the temperature of the resonator 2) of the first enclosure 10 flows through the first heat generation element 4 to thereby make the first heat generation element 4 generate heat. Further, in the case in which the control circuit 33 has determined that the internal temperature (the temperature of the resonator 2) of the first enclosure 10 is higher than the first specified temperature Tset1 based on the output voltage of the first temperature sensor 5, the control circuit 33 performs the control so that no current flows through the first heat generation element 4 to thereby stop the heat generation by the first heat generation element 4.

Then, the control circuit 33 repeats the process in the step S52 and the subsequent steps.

In the flowchart shown in FIG. 5, the period during which the steps S50 through S54 are repeated corresponds to the start-up period, and the control circuit 33 sets the start-up period based on the temperature (the internal temperature of the second enclosure 20) detected by the second temperature sensor 7.

Figure 6:
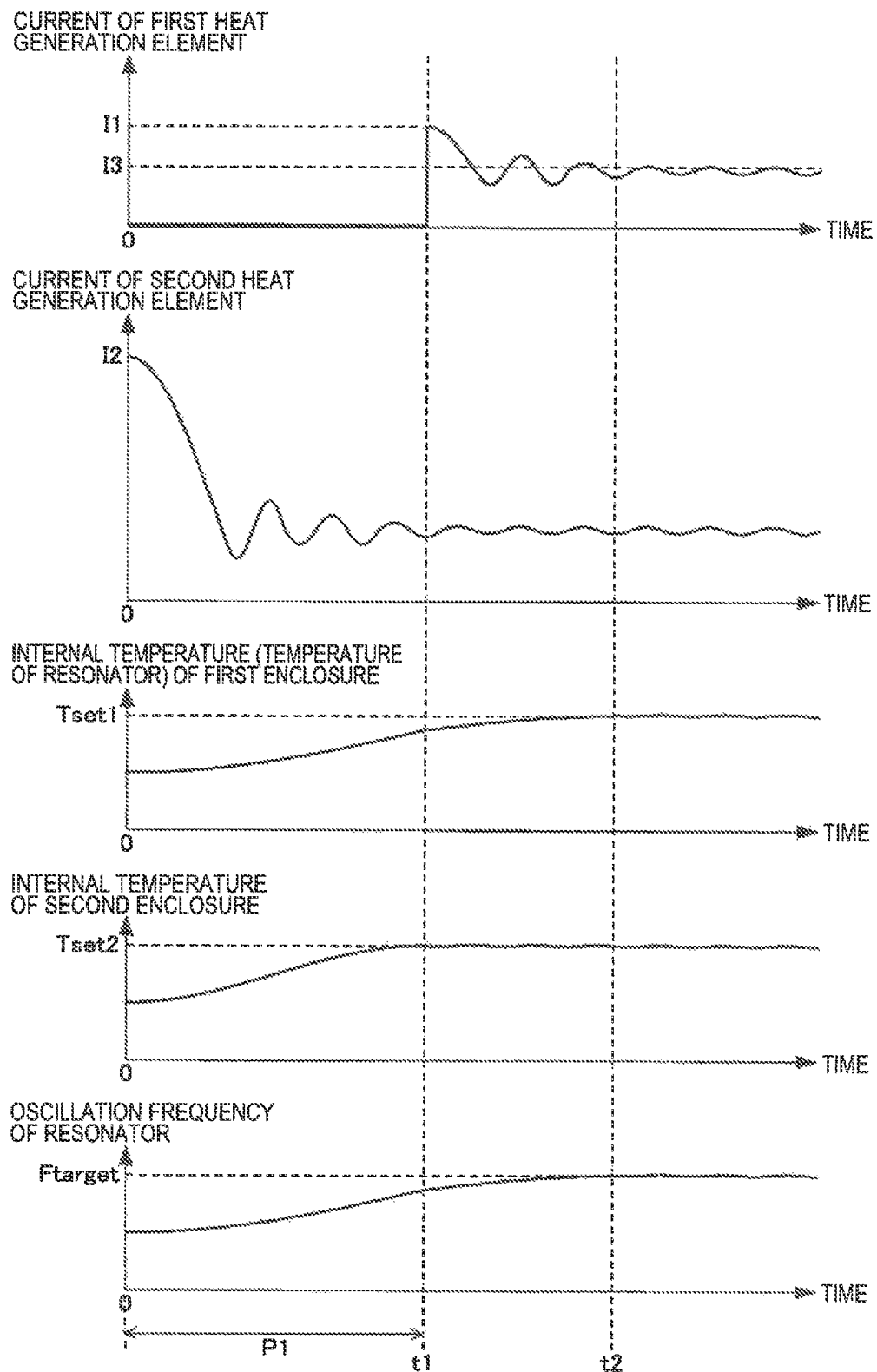
FIG. 6 is a diagram showing the condition of the temporal changes in the current of a first heat generation element, the current of a second heat generation element, the internal temperature of a first enclosure, the internal temperature of a second enclosure, and the oscillation frequency of a resonator in the case of performing the heat generation control with the procedure shown in FIG. 5.

FIG. 6 is a diagram showing the condition of the temporal changes in the current of the first heat generation element 4, the current of the second heat generation element 6, the internal temperature of the first enclosure 10, the internal temperature of the second enclosure 20, and the oscillation frequency of the resonator 2 in the case in which the control circuit 33 performs the heat generation control with the procedure shown in FIG. 5. In the example shown in FIG. 6, the time of startup of the oscillator 1 (when the oscillator 1 is powered on) is defined as time 0. Further, in the example shown in FIG. 6, the resonator 2 is an SC-cut quartz crystal resonator having the quadratic frequency-temperature characteristic, and has a peak of the oscillation frequency in, for example, the vicinity of 80° C. Further, the ambient temperature at the time of startup of the oscillator 1 (when the oscillator 1 is powered on) is in the vicinity of, for example, 25° C., and the first specified temperature Tset1 and the second specified temperature Tset2 are both in the vicinity of, for example, 80° C. (in the vicinity of the temperature at which the oscillation frequency of the resonator 2 has a peak).

In the example shown in FIG. 6, the control circuit 33 controls (the step S52 shown in FIG. 5) the current of the second heat generation element 6 from the time 0 based on the output voltage of the second temperature sensor 7. The internal temperature of the first enclosure 10 and the internal temperature of the second enclosure 20 at the time of startup of the oscillator 1 (when the oscillator 1 is powered on) are both close to the ambient temperature (e.g., the vicinity of 25° C.) of the oscillator 1. Therefore, since the internal temperature of the second enclosure 20 is lower than the second specified temperature Tset2, and further the difference between the second specified temperature Tset2 and the internal temperature of the second enclosure 20 is large, the high current I2 is flowing through the second heat generation element 6 at the time 0. Further, the oscillation frequency of the resonator 2 is lower than the target frequency Ftarget.

Subsequently, as the internal temperature of the second enclosure 20 rises due to the heat generation by the second heat generation element 6, the difference between the second specified temperature Tset2 and the internal temperature of the second enclosure 20 decreases. Therefore, the current flowing through the second heat generation element 6 gradually decreases, and the internal temperature of the second enclosure 20 becomes stable at the second specified temperature Tset2.

Further, the control circuit 33 performs the control so that no current flows through the first heat generation element 4 (step S50 shown in FIG. 5) and the current of the first heat generation element 4 is nearly 0 (a small amount of current due to the leakage current and so on) in the start-up period P1 from the time 0 to the time t1 when the internal temperature of the second enclosure 20 reaches the temperature (the predetermined temperature range) in the vicinity of the second specified temperature Tset2. It should be noted that in the start-up period P1, as the internal temperature of the second enclosure 20 rises due to the heat generation of the second heat generation element 6, the internal temperature of the first enclosure 10 housed in the second enclosure 20 also rises. Further, as the internal temperature of the first enclosure 10 rises, the temperature of the resonator 2 also rises, and the oscillation frequency of the resonator 2 gradually rises. Then, at the time t1, the oscillation frequency of the resonator 2 turns to, for example, a frequency several tens of ppm lower than the target frequency Ftarget.

Then, at and after the time t1, the control circuit 33 controls (step S52 shown in FIG. 5) the current of the second heat generation element 6 based on the output voltage of the second temperature sensor 7, and at the same time, controls (step S58 shown in FIG. 5) the current of the first heat generation element 4 based on the output voltage of the first temperature sensor 5. At the time t1, since the internal temperature (the temperature of the resonator 2) of the first enclosure 10 is lower than the first specified temperature Tset1, and further the difference between the first specified temperature Tset1 and the internal temperature (the temperature of the resonator 2) of the first enclosure 10 is large, the high current I1 is flowing through the first heat generation element 4.

Subsequently, as the internal temperature (the temperature of the resonator 2) of the first enclosure 10 rises due to the heat generation by the first heat generation element 4, the difference between the first specified temperature Tset1 and the internal temperature (the temperature of the resonator 2) of the first enclosure 10 decreases. Therefore, the current flowing through the first heat generation element 4 gradually decreases, and at and after the time t2, the internal temperature (the temperature of the resonator 2) of the first enclosure 10 becomes stable at the first specified temperature Tset1. Further, as the internal temperature (the temperature of the resonator 2) of the first enclosure 10 rises due to the heat generation of the first heat generation element 4, the oscillation frequency of the resonator 2 gradually rises, and then becomes stable at and after the time t2 at the target frequency Ftarget.

As described above, according to the procedure shown in FIG. 5, the internal temperature (the temperature of the resonator 2) of the first enclosure 10 is stabilized at the first specified temperature Tset1. Further, since the internal temperature of the second enclosure 20 is stabilized at the second specified temperature Tset2, even if the ambient temperature of the oscillator 1 dramatically varies, only a little influence is exerted on the internal temperature (the temperature of the resonator 2) of the first enclosure 10, and the internal temperature (the temperature of the resonator 2) of the first enclosure 10 hardly varies. Therefore, since the temperature of the resonator 2 is kept at the first specified temperature Tset1, the oscillator 1 extremely high in frequency stability can be realized.

Further, as shown in FIG. 6, the control circuit 33 performs the control so as to make the current (nearly 0) consumed in the first heat generation element 4 in the start-up period P1 lower than the maximum value I3 of the current consumed in the first heat generation element 4 after the resonator 2 reaches the first specified temperature Tset1. Therefore, in the start-up period P1, since the current consumption of the first heat generation element 4 is low even though the current consumption of the second heat generation element 6 is high, there is a little possibility that the sum of the current consumption of the first heat generation element 4 and the current consumption of the second heat generation element 6 becomes excessively high. Further, also at the point immediately after the start-up period P1 elapses at which the current consumption of the first heat generation element 4 becomes the highest, since the current consumption of the second heat generation element 6 is relatively low, there is a little possibility that the sum of the current consumption of the first heat generation element 4 and the current consumption of the second heat generation element 6 becomes excessively high. Therefore, it is possible to reduce the possibility that the maximum value of the power consumption of the oscillator 1 becomes excessively high.

In particular, according to the procedure shown in FIG. 5, in the start-up period P1, due to the heat generation of the second heat generation element 6, not only the internal temperature of the second enclosure 20 but also the internal temperature (the temperature of the resonator 2) of the first enclosure 10 rises. Therefore, at the time t1 at which the start-up period P1 has elapsed, since the difference between the internal temperature (the temperature of the resonator 2) of the first enclosure 10 and the first specified temperature Tset1 is relatively small, it is possible to lower the maximum value of the current flowing through the first heat generation element 4. Therefore, it is possible to suppress the maximum value of the power consumption of the oscillator 1 to a low level compared to the procedure shown in FIG. 3.

1-2. Second Embodiment

In the oscillator 1 according to the second embodiment, substantially the same constituents as in the oscillator 1 according to the first embodiment are denoted by the same symbols to omit the descriptions of the content overlapping the first embodiment, and the description will be presented with a focus on the content different from the first embodiment. Since the structure of the oscillator 1 according to the second embodiment can substantially be the same as that of the oscillator 1 (FIG. 1) according to the first embodiment, the illustration and the explanation thereof will be omitted.

Figure 7:
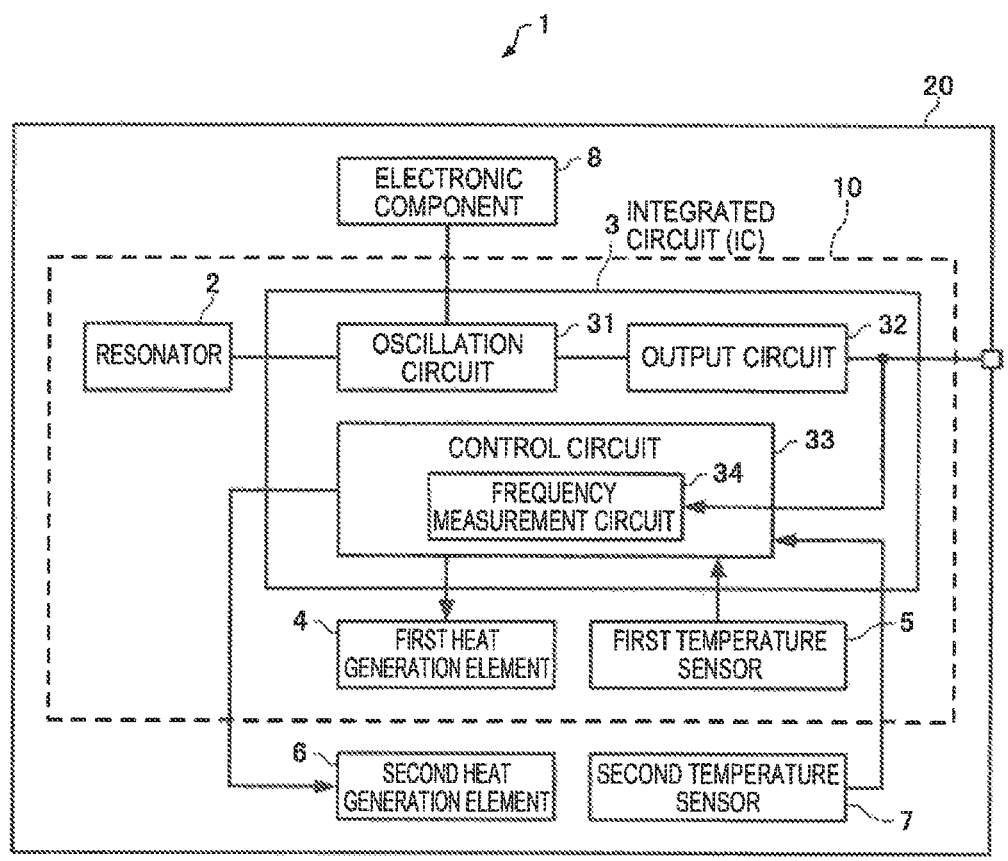
FIG. 7 is a functional block diagram of an oscillator according to a second embodiment of the invention.

FIG. 7 is a functional block diagram of the oscillator 1 according to the second embodiment. As shown in FIG. 7, in the oscillator 1 according to the second embodiment, the control circuit 33 has a frequency measurement circuit 34 for measuring the oscillation frequency of the resonator 2, and sets the start-up period based on the oscillation frequency measured by the frequency measurement circuit 34. For example, it is also possible for the frequency measurement circuit 34 to measure the frequency of the oscillation signal output by the output circuit 32 to thereby indirectly measure the oscillation frequency of the resonator 2. Then, the control circuit 33 suppresses (performs, for example, the control so as to prevent the current from flowing) an increase in the current consumed in at least one of the first heat generation element 4 and the second heat generation element 6 during the start-up period.

Figure 8:
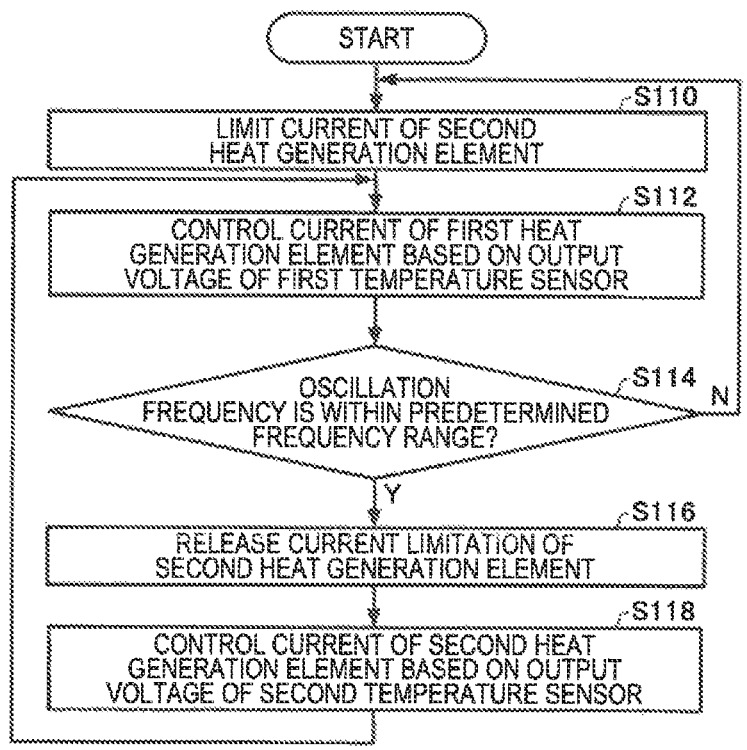
FIG. 8 is a flowchart showing an example of a procedure of heat generation control by the oscillator according to the second embodiment.

FIG. 8 is a flowchart showing an example of a procedure of the heat generation control of the first heat generation element 4 and the second heat generation element 6 by the control circuit 33 in the oscillator 1 according to the second embodiment.

In the example shown in FIG. 8, when the desired power supply voltage is supplied to the oscillator 1 (the control circuit 33), the control circuit 33 performs a process in the step S110 and the step S112 similarly to the step S10 and the step S12 shown in FIG. 3.

Then, the control circuit 33 determines (S114) whether or not the oscillation frequency measured by the frequency measurement circuit 34 is within a predetermined frequency range. Here, the predetermined frequency range is determined in advance taking the target frequency Ftarget, the maximum current consumption of the oscillator 1, and so on into consideration. For example, the predetermined frequency range can be a range of plus/minus several ppm with respect to the target frequency Ftarget, or can also be set to the range, in which the oscillation frequency is equal to or higher than a frequency necessarily several ppm lower than the target frequency Ftarget, if the oscillation frequency at the time of startup of (when powering on) the oscillator 1 is necessarily lower than the target frequency Ftarget.

If the oscillation frequency is out of the predetermined frequency range (N in S114), the control circuit 33 continues the control in the step S110 and the step S112, and performs the determination in the step S114 again.

Further, if the oscillation frequency is within the predetermined frequency range (Y in S114), the control circuit 33 performs the process in the step S116 and the step S118 similarly to the step S16 and the step S18 shown in FIG. 3. Then, the control circuit 33 repeats the process in the step S112 and the subsequent steps.

In the flowchart shown in FIG. 8, the period during which the steps S110 through S114 are repeated corresponds to the start-up period, and the control circuit 33 sets the start-up period based on the oscillation frequency measured by the frequency measurement circuit 34.

In the case in which the control circuit 33 performs the heat generation control with the procedure shown in FIG. 8, the condition of the temporal changes in the current of the first heat generation element 4, the current of the second heat generation element 6, the internal temperature of the first enclosure 10, the internal temperature of the second enclosure 20, and the oscillation frequency of the resonator 2 is substantially the same as shown in FIG. 4, and therefore the illustration and the explanation thereof will be omitted.

As shown in FIG. 4, according to the procedure shown in FIG. 8, the internal temperature (the temperature of the resonator 2) of the first enclosure 10 is stabilized at the first specified temperature Tset1. Further, since the internal temperature of the second enclosure 20 is stabilized at the second specified temperature Tset2, even if the ambient temperature of the oscillator 1 dramatically varies, only a little influence is exerted on the internal temperature (the temperature of the resonator 2) of the first enclosure 10, and the internal temperature (the temperature of the resonator 2) of the first enclosure 10 hardly varies. Therefore, since the temperature of the resonator 2 is kept at the first specified temperature Tset1, the oscillator 1 extremely high in frequency stability can be realized.

Further, as shown in FIG. 4, the control circuit 33 performs the control so as to make the current (nearly 0)

consumed in the second heat generation element 6 in the start-up period P1 lower than the maximum value (I2) of the current consumed in the second heat generation element 6 after the resonator 2 reaches the first specified temperature Tset1. Therefore, in the start-up period P1, since the current consumption of the second heat generation element 6 is low even though the current consumption of the first heat generation element 4 is high, there is a little possibility that the sum of the current consumption of the first heat generation element 4 and the current consumption of the second heat generation element 6 becomes excessively high. Further, also at the point immediately after the start-up period P1 elapses at which the current consumption of the second heat generation element 6 becomes the highest, since the current consumption of the first heat generation element 4 is relatively low, there is a little possibility that the sum of the current consumption of the first heat generation element 4 and the current consumption of the second heat generation element 6 becomes excessively high. Therefore, it is possible to reduce the possibility that the maximum value of the power consumption of the oscillator 1 becomes excessively high.

In particular, according to the procedure shown in FIG. 8, since the control circuit 33 makes the first heat generation element 4 start generating heat immediately after the startup of the oscillator 1, it is possible to shorten the time until the internal temperature (the temperature of the resonator 2) of the first enclosure 10 reaches the first specified temperature Tset1. Therefore, it is possible to shorten the time until the oscillator 1 stably oscillates at the target frequency Ftarget compared to a procedure shown in FIG. 9 described later.

Figure 9:
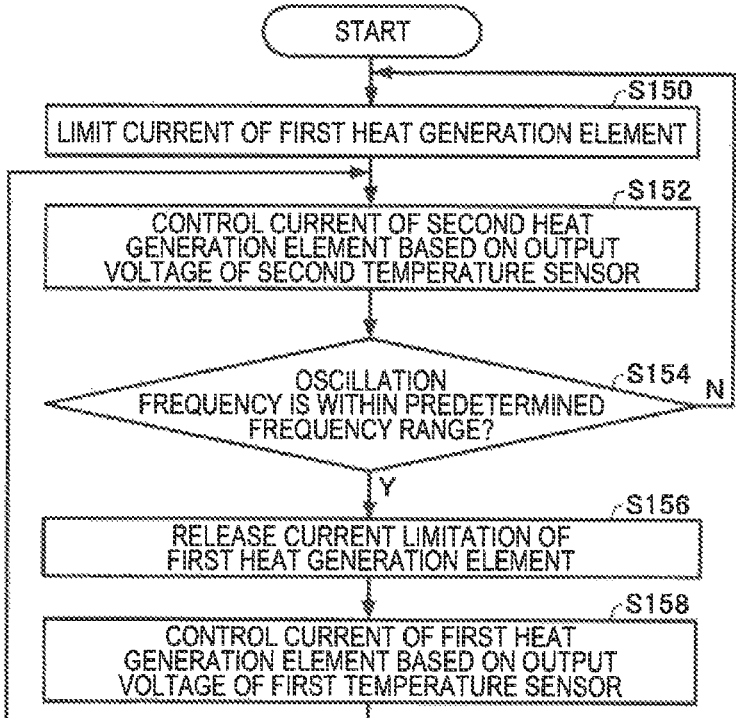
FIG. 9 is a flowchart showing another example of the procedure of the heat generation control by the oscillator according to the second embodiment.

FIG. 9 is a flowchart showing another example of the procedure of the heat generation control of the first heat generation element 4 and the second heat generation element 6 by the control circuit 33 in the oscillator 1 according to the second embodiment.

In the example shown in FIG. 9, when the desired power supply voltage is supplied to the oscillator 1 (the control circuit 33), the control circuit 33 performs a process in the step S150 and the step S152 similarly to the step S50 and the step S52 shown in FIG. 5.

Then, the control circuit 33 determines (S154) whether or not the oscillation frequency measured by the frequency measurement circuit 34 is within a predetermined frequency range. Here, the predetermined frequency range is determined in advance taking the target frequency Ftarget, the maximum current consumption of the oscillator 1, and so on into consideration. For example, the predetermined frequency range can be a range of plus/minus several tens of ppm with respect to the target frequency Ftarget, or can also be set to the range, in which the oscillation frequency is equal to or higher than a frequency necessarily several tens of ppm lower than the target frequency Ftarget, if the oscillation frequency at the time of startup of (when powering on) the oscillator 1 is necessarily lower than the target frequency Ftarget.

If the oscillation frequency is out of the predetermined frequency range (N in S154), the control circuit 33 continues the control in the step S150 and the step S152, and performs the determination in the step S154 again.

Further, if the oscillation frequency is within the predetermined frequency range (Y in S154), the control circuit 33 performs the process in the step S156 and the step S158 similarly to the step S56 and the step S58 shown in FIG. 5. Then, the control circuit 33 repeats the process in the step S152 and the subsequent steps.

In the flowchart shown in FIG. 9, the period during which the steps S150 through S154 are repeated corresponds to the start-up period, and the control circuit 33 sets the start-up period based on the oscillation frequency measured by the frequency measurement circuit 34.

In the case in which the control circuit 33 performs the heat generation control with the procedure shown in FIG. 9, the condition of the temporal changes in the current of the first heat generation element 4, the current of the second heat generation element 6, the internal temperature of the first enclosure 10, the internal temperature of the second enclosure 20, and the oscillation frequency of the resonator 2 is substantially the same as shown in FIG. 6, and therefore the illustration and the explanation thereof will be omitted.

As shown in FIG. 6, according to the procedure shown in FIG. 9, the internal temperature (the temperature of the resonator 2) of the first enclosure 10 is stabilized at the first specified temperature Tset1. Further, since the internal temperature of the second enclosure 20 is stabilized at the second specified temperature Tset2, even if the ambient temperature of the oscillator 1 dramatically varies, only a little influence is exerted on the internal temperature (the temperature of the resonator 2) of the first enclosure 10, and the internal temperature (the temperature of the resonator 2) of the first enclosure 10 hardly varies. Therefore, since the temperature of the resonator 2 is kept at the first specified temperature Tset1, the oscillator 1 extremely high in frequency stability can be realized.

Further, as shown in FIG. 6, the control circuit 33 performs the control so as to make the current (nearly 0) consumed in the first heat generation element 4 in the start-up period P1 lower than the maximum value I3 of the current consumed in the first heat generation element 4 after the resonator 2 reaches the first specified temperature Tset1. Therefore, in the start-up period P1, since the current consumption of the first heat generation element 4 is low even though the current consumption of the second heat generation element 6 is high, there is a little possibility that the sum of the current consumption of the first heat generation element 4 and the current consumption of the second heat generation element 6 becomes excessively high. Further, also at the point immediately after the start-up period P1 elapses at which the current consumption of the first heat generation element 4 becomes the highest, since the current consumption of the second heat generation element 6 is relatively low, there is a little possibility that the sum of the current consumption of the first heat generation element 4 and the current consumption of the second heat generation element 6 becomes excessively high. Therefore, it is possible to reduce the possibility that the maximum value of the power consumption of the oscillator 1 becomes excessively high.

In particular, according to the procedure shown in FIG. 9, in the start-up period P1, due to the heat generation of the second heat generation element 6, not only the internal temperature of the second enclosure 20 but also the internal temperature (the temperature of the resonator 2) of the first enclosure 10 rises. Therefore, at the time t1 at which the start-up period P1 has elapsed, since the difference between the internal temperature (the temperature of the resonator 2) of the first enclosure 10 and the first specified temperature Tset1 is relatively small, it is possible to lower the maximum value of the current flowing through the first heat generation element 4. Therefore, it is possible to suppress the maximum value of the power consumption of the oscillator 1 to a low level compared to the procedure shown in FIG. 8.

1-3. Third Embodiment

In the oscillator 1 according to the third embodiment, substantially the same constituents as in the oscillator 1 according to the first embodiment are denoted by the same symbols to omit the descriptions of the content overlapping the first embodiment, and the description will be presented with a focus on the content different from the first embodiment. Since the structure of the oscillator 1 according to the third embodiment can substantially be the same as that of the oscillator 1 (FIG. 1) according to the first embodiment, the illustration and the explanation thereof will be omitted.

Figure 10:
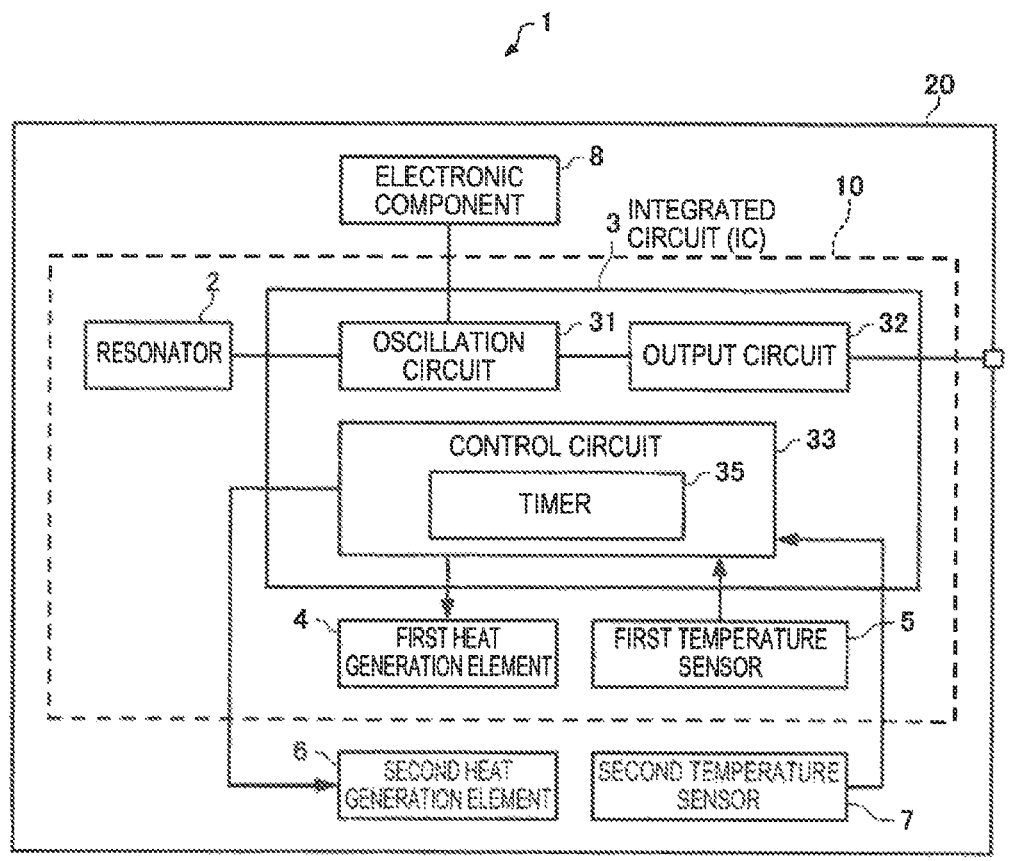
FIG. 10 is a functional block diagram of an oscillator according to a third embodiment of the invention.

FIG. 10 is a functional block diagram of the oscillator 1 according to the third embodiment. As shown in FIG. 10, in the oscillator 1 according to the third embodiment, the control circuit 33 has a timer 35 for measuring the time having elapsed from when the resonator 2 has started the action, and sets the start-up period based on the elapsed time measured by the timer 35. For example, the timer 35 can also be a counter, which increases a count value with a predetermined period from the time of startup of (when powering on) the oscillator 1 (the control circuit 33). Then, the control circuit 33 suppresses (performs, for example, the control so as to prevent the current from flowing) an increase in the current consumed in at least one of the first heat generation element 4 and the second heat generation element 6 during the start-up period.

Figure 11:
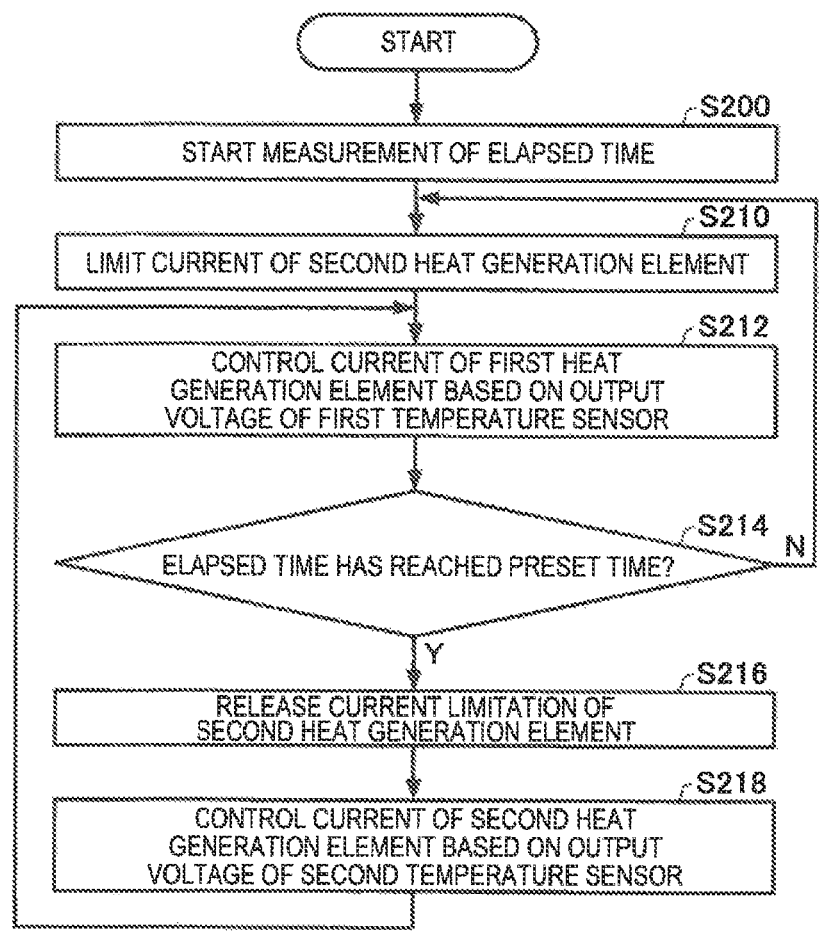
FIG. 11 is a flowchart showing an example of a procedure of heat generation control by the oscillator according to the third embodiment.

FIG. 11 is a flowchart showing an example of a procedure of the heat generation control of the first heat generation element 4 and the second heat generation element 6 by the control circuit 33 in the oscillator 1 according to the third embodiment.

In the example shown in FIG. 11, when a desired power supply voltage is supplied to the oscillator 1 (the control circuit 33), the control circuit 33 starts (S200) the measurement of the elapsed time by the timer 35.

Then, the control circuit 33 performs the process in the step S210 and the step S212 similarly to the step S10 and the step S12 shown in FIG. 3.

Then, the control circuit 33 determines (S214) whether or not the elapsed time measured by the timer 35 has reached the specified time. Here, the specified time is determined in advance taking the first specified temperature Tset1 (or the target frequency Ftarget), the maximum current consumption of the oscillator 1, and so on into consideration. For example, the specified time can also be the time assumed to be the time until the internal temperature of the first enclosure 10 enters the range of plus/minus several degrees Celsius with respect to the first specified temperature Tset1 (alternatively, the time until the oscillation frequency of the resonator 2 enters the range of plus/minus several ppm with respect to the target frequency Ftarget) from the startup of the oscillator 1.

If the elapsed time has not reached the specified time (N in S214), the control circuit 33 continues the control in the step S210 and the step S212, and performs the determination in the step S214 again.

Further, if the elapsed time has reached the specified time (Y in S214), the control circuit 33 performs the process in the step S216 and the step S218 similarly to the step S16 and the step S18 shown in FIG. 3. Then, the control circuit 33 repeats the process in the step S212 and the subsequent steps.

In the flowchart shown in FIG. 11, the period during which the steps S210 through S214 are repeated corresponds to the start-up period, and the control circuit 33 sets the start-up period based on the elapsed time measured by the timer 35.

In the case in which the control circuit 33 performs the heat generation control with the procedure shown in FIG. 11, the condition of the temporal changes in the current of the first heat generation element 4, the current of the second heat generation element 6, the internal temperature of the first enclosure 10, the internal temperature of the second enclosure 20, and the oscillation frequency of the resonator 2 is substantially the same as shown in FIG. 4, and therefore the illustration and the explanation thereof will be omitted.

As shown in FIG. 4, according to the procedure shown in FIG. 11, the internal temperature (the temperature of the resonator 2) of the first enclosure 10 is stabilized at the first specified temperature Tset1. Further, since the internal temperature of the second enclosure 20 is stabilized at the second specified temperature Tset2, even if the ambient temperature of the oscillator 1 dramatically varies, only a little influence is exerted on the internal temperature (the temperature of the resonator 2) of the first enclosure 10, and the internal temperature (the temperature of the resonator 2) of the first enclosure 10 hardly varies. Therefore, since the temperature of the resonator 2 is kept at the first specified temperature Tset1, the oscillator 1 extremely high in frequency stability can be realized.

Further, as shown in FIG. 4, the control circuit 33 performs the control so as to make the current (nearly 0) consumed in the second heat generation element 6 in the start-up period P1 lower than the maximum value (I2) of the current consumed in the second heat generation element 6 after the resonator 2 reaches the first specified temperature Tset1. Therefore, in the start-up period P1, since the current consumption of the second heat generation element 6 is low even though the current consumption of the first heat generation element 4 is high, there is a little possibility that the sum of the current consumption of the first heat generation element 4 and the current consumption of the second heat generation element 6 becomes excessively high. Further, also at the point immediately after the start-up period P1 elapses at which the current consumption of the second heat generation element 6 becomes the highest, since the current consumption of the first heat generation element 4 is relatively low, there is a little possibility that the sum of the current consumption of the first heat generation element 4 and the current consumption of the second heat generation element 6 becomes excessively high. Therefore, it is possible to reduce the possibility that the maximum value of the power consumption of the oscillator 1 becomes excessively high.

In particular, according to the procedure shown in FIG. 11, since the control circuit 33 makes the first heat generation element 4 start generating heat immediately after the startup of the oscillator 1, it is possible to shorten the time until the internal temperature (the temperature of the resonator 2) of the first enclosure 10 reaches the first specified temperature Tset1. Therefore, it is possible to shorten the time until the oscillator 1 stably oscillates at the target frequency Ftarget compared to a procedure shown in FIG. 12 described later.

Figure 12:
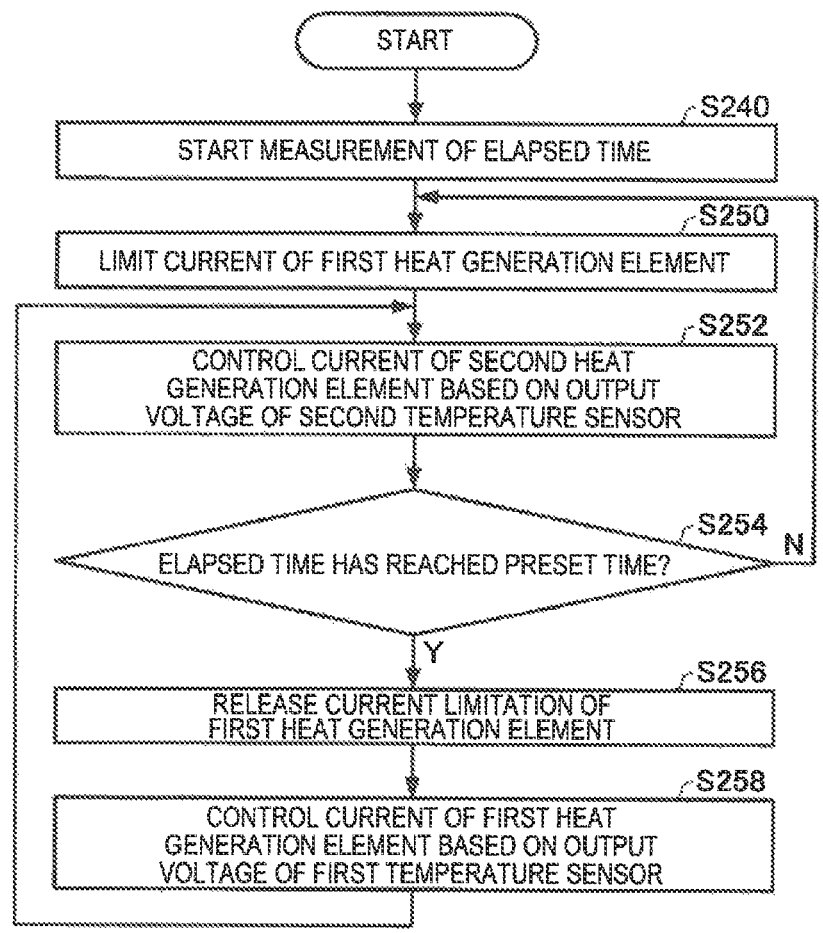
FIG. 12 is a flowchart showing another example of the procedure of the heat generation control by the oscillator according to the third embodiment.

FIG. 12 is a flowchart showing another example of the procedure of the heat generation control of the first heat generation element 4 and the second heat generation element 6 by the control circuit 33 in the oscillator 1 according to the third embodiment.

In the example shown in FIG. 12, when a desired power supply voltage is supplied to the oscillator 1 (the control circuit 33), the control circuit 33 starts (S240) the measurement of the elapsed time by the timer 35.

Then, the control circuit 33 performs the process in the step S250 and the step S252 similarly to the step S50 and the step S52 shown in FIG. 5.

Then, the control circuit 33 determines (S254) whether or not the elapsed time measured by the timer 35 has reached the specified time. Here, the specified time is determined in advance taking the second specified temperature Tset2 (or the target frequency Ftarget), the maximum current consumption of the oscillator 1, and so on into consideration. For example, the specified time can also be the time assumed to be the time until the internal temperature of the second enclosure 20 enters the range of plus/minus several degrees Celsius with respect to the second specified temperature Tset2 (alternatively, the time until the oscillation frequency of the resonator 2 enters the range of plus/minus several tens of ppm with respect to the target frequency Ftarget) from the startup of the oscillator 1.

If the elapsed time has not reached the specified time (N in S254), the control circuit 33 continues the control in the step S250 and the step S252, and performs the determination in the step S254 again.

Further, if the elapsed time has reached the specified time (Y in S254), the control circuit 33 performs the process in the step S256 and the step S258 similarly to the step S56 and the step S58 shown in FIG. 5. Then, the control circuit 33 repeats the process in the step S252 and the subsequent steps.

In the flowchart shown in FIG. 12, the period during which the steps S250 through S254 are repeated corresponds to the start-up period, and the control circuit 33 sets the start-up period based on the elapsed time measured by the timer 35.

In the case in which the control circuit 33 performs the heat generation control with the procedure shown in FIG. 12, the condition of the temporal changes in the current of the first heat generation element 4, the current of the second heat generation element 6, the internal temperature of the first enclosure 10, the internal temperature of the second enclosure 20, and the oscillation frequency of the resonator 2 is substantially the same as shown in FIG. 6, and therefore the illustration and the explanation thereof will be omitted.

As shown in FIG. 6, according to the procedure shown in FIG. 12, the internal temperature (the temperature of the resonator 2) of the first enclosure 10 is stabilized at the first specified temperature Tset1. Further, since the internal temperature of the second enclosure 20 is stabilized at the second specified temperature Tset2, even if the ambient temperature of the oscillator 1 dramatically varies, only a little influence is exerted on the internal temperature (the temperature of the resonator 2) of the first enclosure 10, and the internal temperature (the temperature of the resonator 2) of the first enclosure 10 hardly varies. Therefore, since the temperature of the resonator 2 is kept at the first specified temperature Tset1, the oscillator 1 extremely high in frequency stability can be realized.

Further, as shown in FIG. 6, the control circuit 33 performs the control so as to make the current (nearly 0) consumed in the first heat generation element 4 in the start-up period P1 lower than the maximum value I3 of the current consumed in the first heat generation element 4 after the resonator 2 reaches the first specified temperature Tset1. Therefore, in the start-up period P1, since the current consumption of the first heat generation element 4 is low even though the current consumption of the second heat generation element 6 is high, there is a little possibility that the sum of the current consumption of the first heat generation element 4 and the current consumption of the second heat generation element 6 becomes excessively high. Further, also at the point immediately after the start-up period P1 elapses at which the current consumption of the first heat generation element 4 becomes the highest, since the current consumption of the second heat generation element 6 is relatively low, there is a little possibility that the sum of the current consumption of the first heat generation element 4 and the current consumption of the second heat generation element 6 becomes excessively high. Therefore, it is possible to reduce the possibility that the maximum value of the power consumption of the oscillator 1 becomes excessively high.

In particular, according to the procedure shown in FIG. 12, in the start-up period P1, due to the heat generation of the second heat generation element 6, not only the internal temperature of the second enclosure 20 but also the internal temperature (the temperature of the resonator 2) of the first enclosure 10 rises. Therefore, at the time t1 at which the start-up period P1 has elapsed, since the difference between the internal temperature (the temperature of the resonator 2) of the first enclosure 10 and the first specified temperature Tset1 is relatively small, it is possible to lower the maximum value of the current flowing through the first heat generation element 4. Therefore, it is possible to suppress the maximum value of the power consumption of the oscillator 1 to a low level compared to the procedure shown in FIG. 11.

1-4. Fourth Embodiment

In the oscillator 1 according to the fourth embodiment, substantially the same constituents as in the oscillator 1 according to the first embodiment are denoted by the same symbols to omit the descriptions of the content overlapping the first embodiment, and the description will be presented with a focus on the content different from the first embodiment. Since the structure of the oscillator 1 according to the fourth embodiment can substantially be the same as that of the oscillator 1 (FIG. 1) according to the first embodiment, the illustration and the explanation thereof will be omitted.

Figure 13:
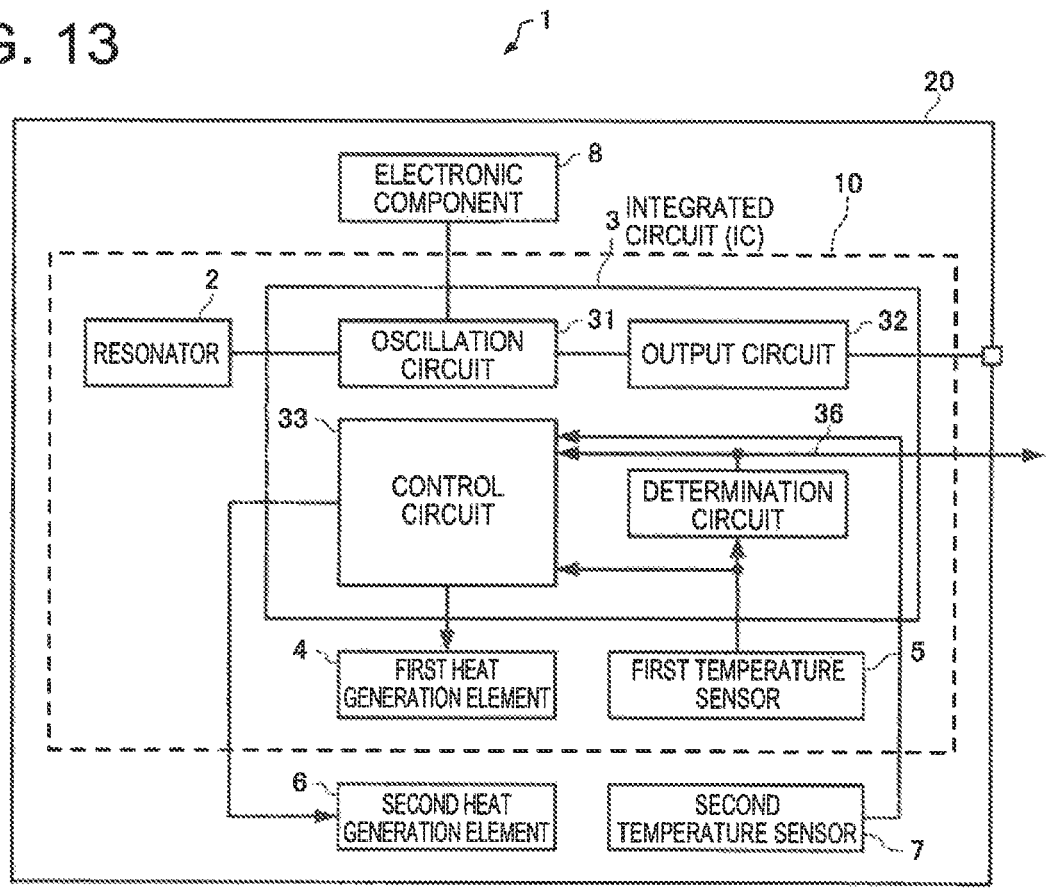
FIG. 13 is a functional block diagram of an oscillator according to a fourth embodiment of the invention.

FIG. 13 is a functional block diagram of the oscillator 1 according to the fourth embodiment. As shown in FIG. 13, in the oscillator 1 according to the fourth embodiment, the integrated circuit (IC) 3 is configured including the oscillation circuit 31, the output circuit 32, and the control circuit 33 similarly to FIG. 2, and further including a determination circuit 36.

The determination circuit 36 outputs a determination signal representing whether or not the difference between the temperature detected by the first temperature sensor 5 and the first specified temperature Tset1 is included in a set range. It is also possible for the determination signal to be input to the control circuit 33, and at the same time output to the outside of the oscillator 1. Thus, it is possible to inform an external device of the fact that the difference between the internal temperature (the temperature of the resonator 2) of the first enclosure 10 and the first specified temperature Tset1 is included in the set range, and thus the output signal of the oscillator 1 has become available. For example, it is also possible for the determination circuit 36 to compare the difference between the output voltage of the first temperature sensor 5 and the voltage corresponding to the first specified temperature Tset1 with a predetermined threshold voltage to thereby determine whether or not the difference between the temperature detected by the first temperature sensor 5 and the first specified temperature Tset1 is included in the set range. Here, the set range (e.g., a threshold voltage) can be, for example, the range of approximately ±0.5 through 1° C. with respect to the first specified temperature Tset1 (e.g., the range in which the oscillation frequency of the resonator 2 is within the range of approximately ±0.5 through 1 ppm with respect to the target frequency Ftarget). Further, it is also possible for the determination circuit 36 to output the determination signal, which becomes in the ON state (e.g., a high level) only in the case in which the difference between the temperature detected by the first temperature sensor 5 and the first specified temperature Tset1 is included in the set range.

Further, the threshold value described above can also be 0° C. Specifically, it is also possible for the determination circuit to determine whether or not the temperature detected by the first temperature sensor 5 has reached the first specified temperature Tset1. In this case, it is also possible for the determination circuit 36 to compare the output voltage of the first temperature sensor 5 with the voltage corresponding to the first specified temperature Tset1 to thereby determine whether or not the temperature detected by the first temperature sensor 5 has reached the first specified temperature Tset1. Then, it is also possible for the determination circuit 36 to output the determination signal, which becomes in the ON state only in the case in which the temperature detected by the first temperature sensor 5 has reached the first specified temperature Tset1.

It is also possible for the determination circuit 36 to set the determination signal to the ON state when a predetermined time elapses after the difference between the temperature detected by the first temperature sensor 5 and the first specified temperature Tset1 has reached the set range. Thus, it is possible to inform the external device of the fact that the internal temperature (the temperature of the resonator 2) of the first enclosure 10 is sufficiently stabilized.

The control circuit 33 sets the start-up period based on the determination signal output by the determination circuit 36. Then, the control circuit 33 suppresses (performs, for example, the control so as to prevent the current from flowing) an increase in the current consumed in at least one of the first heat generation element 4 and the second heat generation element 6 during the start-up period.

Figure 14:
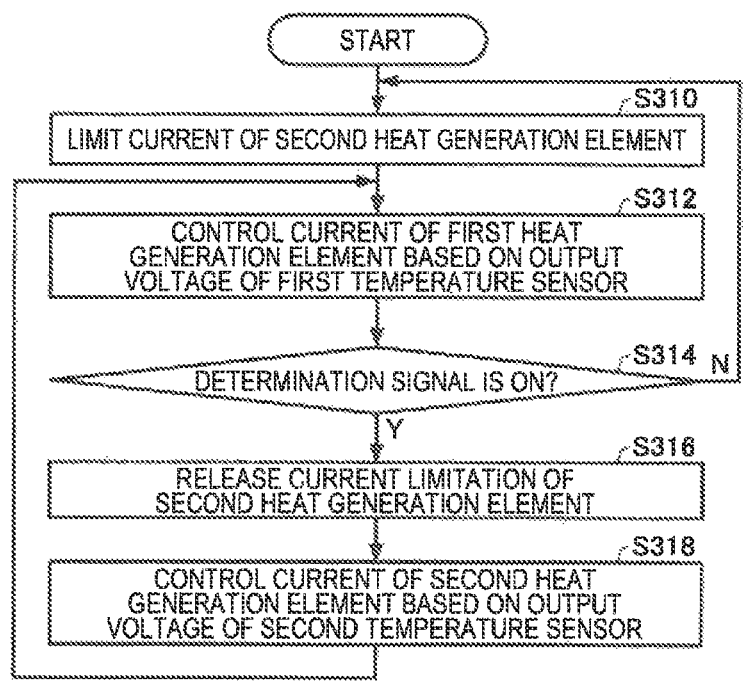
FIG. 14 is a flowchart showing an example of a procedure of heat generation control by the oscillator according to the fourth embodiment.

FIG. 14 is a flowchart showing an example of a procedure of the heat generation control of the first heat generation element 4 and the second heat generation element 6 by the control circuit 33 in the oscillator 1 according to the fourth embodiment.

In the example shown in FIG. 14, when the desired power supply voltage is supplied to the oscillator 1 (the control circuit 33), the control circuit 33 performs a process in step S310 and step S312 similarly to the step S10 and the step S12 shown in FIG. 3.

Then, the control circuit 33 determines (S314) whether the determination signal output by the determination circuit 36 is in the ON state or the OFF state.

If the determination signal is in the OFF state (N in S314), the control circuit 33 continues the control in the step S310 and the step S312, and performs the determination in the step S314 again.

Further, if the determination signal is in the ON state (Y in S314), the control circuit 33 performs the process in the step S316 and the step S318 similarly to the step S16 and the step S18 shown in FIG. 3. Then, the control circuit 33 repeats the process in the step S312 and the subsequent steps.

In the flowchart shown in FIG. 14, the period during which the steps S310 through S314 are repeated corresponds to the start-up period, and the control circuit 33 sets the start-up period based on the determination signal output by the determination circuit 36.

In the case in which the control circuit 33 performs the heat generation control with the procedure shown in FIG. 14, the condition of the temporal changes in the current of the first heat generation element 4, the current of the second heat generation element 6, the internal temperature of the first enclosure 10, the internal temperature of the second enclosure 20, and the oscillation frequency of the resonator 2 is substantially the same as shown in FIG. 4, and therefore the illustration and the explanation thereof will be omitted.

As shown in FIG. 4, according to the procedure shown in FIG. 14, the internal temperature (the temperature of the resonator 2) of the first enclosure 10 is stabilized at the first specified temperature Tset1. Further, since the internal temperature of the second enclosure 20 is stabilized at the second specified temperature Tset2, even if the ambient temperature of the oscillator 1 dramatically varies, only a little influence is exerted on the internal temperature (the temperature of the resonator 2) of the first enclosure 10, and the internal temperature (the temperature of the resonator 2) of the first enclosure 10 hardly varies. Therefore, since the temperature of the resonator 2 is kept at the first specified temperature Tset1, the oscillator 1 extremely high in frequency stability can be realized.

Further, as shown in FIG. 4, the control circuit 33 performs the control so as to make the current (nearly 0) consumed in the second heat generation element 6 in the start-up period P1 lower than the maximum value (I2) of the current consumed in the second heat generation element 6 after the resonator 2 reaches the first specified temperature Tset1. Therefore, in the start-up period P1, since the current consumption of the second heat generation element 6 is low even though the current consumption of the first heat generation element 4 is high, there is a little possibility that the sum of the current consumption of the first heat generation element 4 and the current consumption of the second heat generation element 6 becomes excessively high. Further, also at the point immediately after the start-up period P1 elapses at which the current consumption of the second heat generation element 6 becomes the highest, since the current consumption of the first heat generation element 4 is relatively low, there is a little possibility that the sum of the current consumption of the first heat generation element 4 and the current consumption of the second heat generation element 6 becomes excessively high. Therefore, it is possible to reduce the possibility that the maximum value of the power consumption of the oscillator 1 becomes excessively high.

In particular, according to the procedure shown in FIG. 14, since the control circuit 33 makes the first heat generation element 4 start generating heat immediately after the startup of the oscillator 1, it is possible to shorten the time until the internal temperature (the temperature of the resonator 2) of the first enclosure 10 reaches the first specified temperature Tset1. Therefore, it is possible to shorten the time until the oscillator 1 stably oscillates at the target frequency Ftarget.

1-5. Modified Examples

The first heat generation element 4 is housed inside the first enclosure 10 in each of the embodiments described above, but can be bonded to an external surface of the first enclosure 10.

The first heat generation element 4 and the first temperature sensor 5 are separated from each other in each of the embodiments described above, but can be integrated with each other. Similarly, the second heat generation element 6 and the second temperature sensor 7 are separated from each other, but can be integrated with each other. Further, at least one of the first heat generation element and the first temperature sensor 5 can be integrated with the integrated circuit (IC) 3, and at least one of the second heat generation element 6 and the second temperature sensor 7 can be integrated with the integrated circuit (IC) 3.

Further, the control circuit 33 controls the heat generation of the first heat generation element 4 and the second heat generation element 6 as the two temperature control elements in each of the embodiments described above, but is not limited to this configuration. For example, it is also possible for the control circuit 33 to control heat absorption of a first heat absorption element and a second heat absorption element (e.g., Peltier elements) as the two temperature control elements.

Further, the oscillator 1 controls the internal temperature of the first enclosure 10 and the second enclosure 20 with the first heat generation element 4 and the second heat generation element 6 as the two temperature control elements, respectively, in each of the embodiments described above, but can control the internal temperature of each of the N (N≥3) enclosures with the N temperature control elements, respectively.

Figure 15:
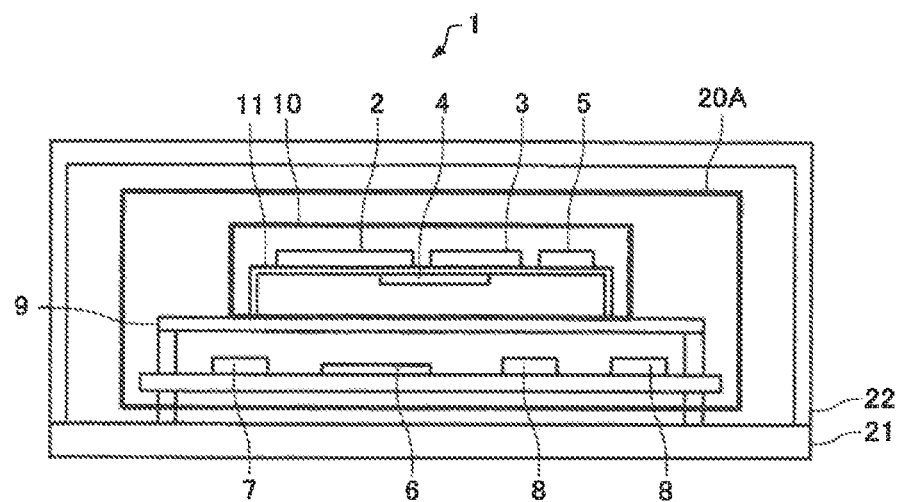
FIG. 15 is an example of a cross-sectional view of an oscillator according to a modified example.

Further, the oscillator 1 has the second enclosure 20 formed of the substrate 21 and the casing 22 in each of the embodiments described above as shown in FIG. 1, but can have, for example, a second enclosure 20A separated from the casing 22 as shown in FIG. 15. It should be noted that in the oscillator 1 having the configuration shown in FIG. 15, it is possible to adopt a modified configuration in which the first heat generation element 4 is bonded to the external surface (an outside surface) of the first enclosure 10, or a modified configuration in which the second heat generation element 6 is bonded to an external surface (an outside surface) of the second enclosure 20.

Further, although in each of the embodiments described above, the oscillator 1 is the oscillator having the resonator 2 such as a quartz crystal resonator as the oscillation source, the oscillation source is not limited to the resonator. For example, the oscillator 1 can be an atomic oscillator having a gas cell in which atoms of cesium, rubidium, or the like are encapsulated as the oscillation source.

2. Electronic Apparatus

Figure 16:
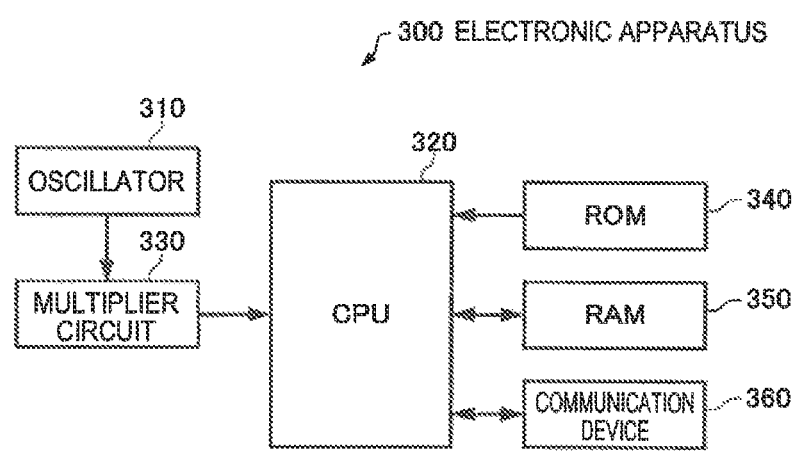
FIG. 16 is a functional block diagram showing an example of a configuration of an electronic apparatus according to an embodiment of the invention.

FIG. 16 is a functional block diagram showing an example of a configuration of an electronic apparatus according to an embodiment of the invention. The electronic apparatus 300 according to the present embodiment is configured including an oscillator 310, a central processing unit (CPU) 320, a multiplier circuit 330, a read only memory (ROM) 340, a random access memory (RAM) 350, and a communication device 360. It should be noted that the electronic apparatus according to the present embodiment can be provided with a configuration obtained by eliminating or modifying some of the constituents (elements) shown in FIG. 16, or adding another constituent thereto.

The oscillator 310 is for outputting an oscillation signal with a desired frequency based on a signal from an oscillation source.

The multiplier circuit 330 is a circuit for multiplying the frequency of the oscillation signal output by the oscillator 310 into a desired frequency, and then outputting the result. The oscillation signal output by the multiplier circuit 330 can be used as a clock signal of the CPU 320, or can be used for the CPU 320 to generate a carrier wave for the communication.

The CPU 320 (a processor) performs, for example, a variety of types of arithmetic processing and control processing based on the oscillation signal output by the oscillator 310 or the oscillation signal output by the multiplier circuit 330 in accordance with the program stored in the ROM 340 and so on.

The ROM 340 stores the programs, data, and so on for the CPU 320 to perform the variety of types of arithmetic processing and control processing.

The RAM 350 is used as a working area of the CPU 320, and temporarily stores the program and data retrieved from the ROM 340, the calculation result obtained by the CPU 320 performing operations in accordance with the variety of programs, and so on.

The communication device 360 performs a variety of types of control processing for achieving the data communication between the CPU 320 and external devices.

By applying the oscillator 1 according to any of the embodiments described above capable of reducing the possibility that the maximum value of the power consumption becomes excessively high, for example, as the oscillator 310, it is possible to realize the electronic apparatus hard to cause a malfunction and high in reliability.

As such an electronic apparatus 300, a variety of electronic apparatuses can be adopted, and there can be cited, for example, a GPS (global positioning system) module, a network apparatus, a broadcast apparatus, a communication apparatus used in an artificial satellite or a base station, a personal computer (e.g., a mobile type personal computer, a laptop personal computer, and a tablet personal computer), a mobile terminal such as a smartphone or a cellular phone, a digital camera, an inkjet ejection device (e.g., an inkjet printer), a storage area network apparatus such as a router or a switch, a local area network apparatus, a base station apparatus for a mobile terminal, a television set, a video camera, a video cassette recorder, a car navigation system, a real-time clock device, a pager, a personal digital assistance (including one having a communication function), an electronic dictionary, an electronic calculator, an electronic game machine, a gaming controller, a word processor, a workstation, a picture phone, a security television monitor, an electronic binoculars, a POS (point of sale) terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments, gauges (e.g., gauges for cars, aircrafts, and boats and ships), a flight simulator, a head-mount display, a motion tracer, a motion tracker, a motion controller, and a pedestrian dead reckoning (PDR) system.

As an example of the electronic apparatus 300 according to the present embodiment, there can be cited a transmission device using the oscillator 310 described above as a reference signal source, and functioning as, for example, a terminal base station device for performing communication with terminals wirelessly or with wire. By applying, for example, the oscillator 1 according to any one of the embodiments described above as the oscillator 310, it is also possible to realize the electronic apparatus 300 which can be used for, for example, a communication base station, which is higher in frequency accuracy than ever before, and for which high performance and high reliability are required.

Further, as another example of the electronic apparatus 300 according to the present embodiment, it is possible to adopt a communication device in which the communication device 360 receives an external clock signal, and the CPU 320 (the processor) includes a frequency controller for controlling the frequency of the oscillator 310 based on the external clock signal and one of the output signal of the oscillator 310 and the output signal of the multiplier circuit 330 (an internal clock signal). The communication device can be a communication apparatus used for, for example, a backbone network apparatus such as Stratum-3, or a femtocell.

3. Base Station

Figure 17:
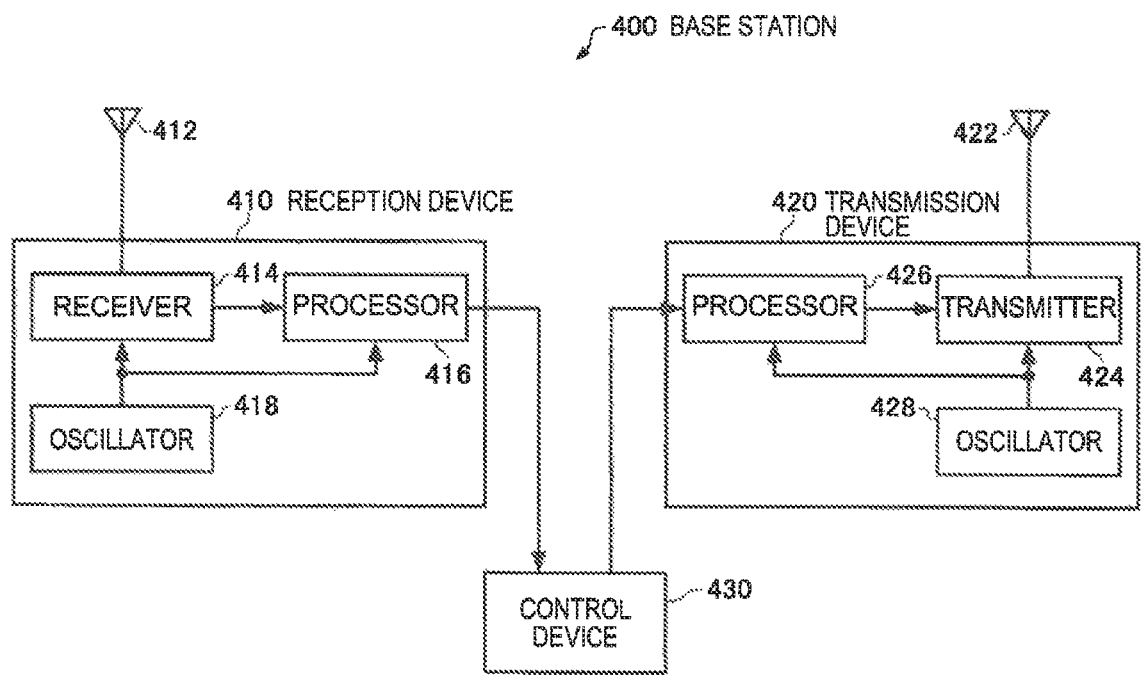
FIG. 17 is a diagram showing an example of a schematic configuration of a base station according to an embodiment of the invention.

FIG. 17 is a diagram showing an example of a schematic configuration of a base station according to an embodiment of the invention. The base station 400 according to the present embodiment is configured including a reception device 410, a transmission device 420, and a control device 430. It should be noted that the electronic apparatus according to the present embodiment can be provided with a configuration obtained by eliminating or modifying some of the constituents (elements) shown in FIG. 17, or adding another constituent thereto.

The reception device 410 is configured including a receiving antenna 412, a receiving circuit 414, a processor 416, and an oscillator 418.

The oscillator 418 is for outputting an oscillation signal with a desired frequency based on a signal from an oscillation source.

The receiving antenna 412 receives a radio wave with a variety of types of information superimposed from a mobile station (not shown) such as a mobile phone or a GPS satellite.

The receiving circuit 414 demodulates the signal received by the receiving antenna 412 into a signal in a desired intermediate frequency band using the oscillation signal output by the oscillator 418.

The processor 416 converts the signal in the intermediate frequency band demodulated by the receiving circuit 414 into a baseband signal using the oscillation signal output by the oscillator 418, and then demodulates the information included in the baseband signal.

The control device 430 receives the information demodulated by the reception device 410 (the processor 416) to perform a variety of processes corresponding to the information. Then, the control device 430 generates information to be transmitted to the mobile station, and then transmits the information to the transmission device 420 (a processor 426).

The transmission device 420 is configured including a transmitting antenna 422, a transmitting circuit 424, the processor 426, and an oscillator 428.

The oscillator 428 is for outputting an oscillation signal with a desired frequency based on a signal from an oscillation source.

The processor 426 generates a baseband signal using the information received from the control device 430, and then converts the baseband signal into a signal in the intermediate frequency band using the oscillation signal output by the oscillator 428.

The transmitting circuit 424 modulates the signal in the intermediate frequency band from the processor 426 and then superimposes the result on the carrier wave using the oscillation signal output by the oscillator 428.

The transmitting antenna 422 transmits the carrier wave from the transmitting circuit 424 to the mobile station such as a mobile phone or a GPS satellite as a radio wave.

By applying the oscillator 1 according to any of the embodiments described above capable of reducing the possibility that the maximum value of the power consumption becomes excessively high, for example, as the oscillator 418 provided to the reception device 410 and the oscillator 428 provided to the transmission device 420, it is possible to realize the base station hard to cause a malfunction, superior in communication performance, and high in reliability.

The invention is not limited to the embodiments described above, but can be implemented with a variety of modifications within the scope or the spirit of the invention.

The embodiments described above are each illustrative only, and the invention is not limited thereto. For example, it is also possible to arbitrarily combine any of the embodiments and the modified examples with each other.

The invention includes configurations (e.g., configurations having the same function, the same way, and the same result, or configurations having the same object and the same advantage) substantially the same as the configuration described as one of the embodiments of the invention. Further, the invention includes configurations obtained by replacing a non-essential part of the configuration explained in the above description of the embodiments. Further, the invention includes configurations providing the same functions and the same advantages or configurations capable of achieving the same object as that of the configurations explained in the description of the embodiments. Further, the invention includes configurations obtained by adding a known technology to the configuration explained in the description of the embodiments.

The invention claimed is:

1. An oscillator comprising:
    an oscillation source;
    a first heat generation element;
    a second heat generation element; and
    a control circuit configured to perform the following control:
        for a specified period of time from when a power voltage is supplied to the control circuit, a current that is caused to flow to the first heat generation element is controlled based on a difference between a temperature inside the oscillator and a setting temperature and no current flows to the second heat generation element, and
        after the specified period of time elapses from when the power voltage is supplied to the control circuit, currents that are caused to flow to the first heat generation element and the second heat generation element are controlled based on the difference between the temperature inside the oscillator and the setting temperature.

2. The oscillator according to claim 1, further comprising:
    a temperature sensor,
    wherein the specified period of time is determined based on a detection temperature of the temperature sensor.

3. The oscillator according to claim 1, wherein the specified period of time is determined based on an oscillation frequency of the oscillation source.

4. The oscillator according to claim 1, further comprising:
    a first enclosure that houses the oscillation source; and
    a second enclosure that houses the first enclosure, wherein:
        the first heat generation element is housed in one of the first and second enclosures, and the second heat generation element is housed in the other of the first and second enclosures.

5. An electronic apparatus comprising the oscillator according to claim 1.

6. A base station comprising the oscillator according to claim 1.

7. A method of controlling an oscillator that includes an oscillation source; a first heat generation element; a second heat generation element; and a control circuit, the method comprising:

for a specified period of time from when a power voltage is supplied to the control circuit, controlling a current that is caused to flow to the first heat generation element based on a difference between a temperature inside the oscillator and a setting temperature, wherein no current flows to the second heat generation element, and after the specified period of time elapses from when the power voltage is supplied to the control circuit, controlling currents that are caused to flow to the first heat generation element and the second heat generation element based on the difference between the temperature inside the oscillator and the setting temperature.

* * * * *